(12) United States Patent
Wang et al.

(10) Patent No.: US 12,254,917 B2
(45) Date of Patent: Mar. 18, 2025

(54) POWER SUPPLY CIRCUIT, MEMORY, TESTING DEVICE, MEMORY SYSTEM, AND ELECTRONIC DEVICE

(71) Applicant: Yangtze Memory Technologies Co., Ltd., Hubei (CN)

(72) Inventors: Yu Wang, Hubei (CN); BiRuo Song, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 166 days.

(21) Appl. No.: 18/090,065

(22) Filed: Dec. 28, 2022

(65) Prior Publication Data
US 2024/0170041 A1    May 23, 2024

(30) Foreign Application Priority Data
Nov. 18, 2022 (CN) .......................... 202211449376.1

(51) Int. Cl.
| | | |
|---|---|---|
| *G11C 11/4074* | (2006.01) | |
| *G11C 11/4076* | (2006.01) | |
| *G11C 29/50* | (2006.01) | |
| *H02M 3/155* | (2006.01) | |

(52) U.S. Cl.
CPC ...... *G11C 11/4074* (2013.01); *G11C 11/4076* (2013.01); *G11C 29/50004* (2013.01); *H02M 3/155* (2013.01); *G11C 2029/5004* (2013.01)

(58) Field of Classification Search
CPC ............ G11C 11/4074; G11C 11/4076; G11C 29/50004; G11C 2029/5004; H02M 3/155

USPC .......................................................... 365/226
See application file for complete search history.

(56) References Cited

U.S. PATENT DOCUMENTS

| | | | | |
|---|---|---|---|---|
| 7,375,566 B2* | 5/2008 | Lin | ...................... | H03K 3/0307 327/291 |
| 2009/0289615 A1* | 11/2009 | Foley | .................... | G06F 1/3203 323/318 |
| 2013/0027097 A1* | 1/2013 | Wang | .................... | H03L 7/0891 327/156 |
| 2023/0058758 A1* | 2/2023 | Tramoni | ................ | G06F 1/263 |

* cited by examiner

*Primary Examiner* — Ly D Pham
(74) *Attorney, Agent, or Firm* — Oblon, McClelland, Maier & Neustadt, L.L.P.

(57) ABSTRACT

The disclosure provides a power supply circuit, a memory, a testing device, a memory system and an electronic device, relates to the memory technologies, and may reduce the testing time of the memory and the footprint occupation of the memory. The power supply circuit can include a voltage adjusting circuit and an oscillation circuit. A first voltage output terminal of the voltage adjusting circuit is coupled with a power supply input terminal of a delay chain circuit in the memory and coupled with a power supply input terminal of the oscillation circuit. The voltage adjusting circuit is configured to output a first voltage to the delay chain circuit and the oscillation circuit via the first voltage output terminal. The oscillation circuit is configured to generate a clock signal corresponding to the first voltage. The voltage adjusting circuit is also configured to receive an adjusting signal for adjust the first voltage.

20 Claims, 11 Drawing Sheets

POWER SUPPLY CIRCUIT, MEMORY, TESTING DEVICE, MEMORY SYSTEM, AND ELECTRONIC DEVICE

CROSS-REFERENCE TO RELATED APPLICATIONS

This present disclosure claims the benefit of Chinese Patent Application No. 202211449376.1 filed on Nov. 18, 2022, which is incorporated herein by reference in its entirety.

TECHNICAL FIELD

The present disclosure relates to the field of memory technologies, in particular to a power supply circuit, a memory, a testing device, a memory system and an electronic device.

BACKGROUND

Delay parameters of memories, such as Dynamic Random Access Memory (DRAM), are mainly determined by a delay chain circuit. The delay chain circuit here includes a plurality of delay units and a bypass gate circuit. Generally, a fine-tuning control may be implemented by fine-tuning terminals in the bypass gate circuit to control a number of delay units, through which a control signal passes, in the delay chain circuit, so as to implement the delay of the delay chain circuit.

Here, the performance of delay units may be easily affected by the change of process corners. Therefore, it is particularly important to control to change the delays implemented by the delay chain circuit in DRAM fabrication with the change of process corners. The above fine-tuning control by the fine-tuning control terminals in the bypass gate circuit requires testing the DRAM after the DRAM chip has been fabricated, so as to determine the delay chain circuit within the range of process corners of the DRAM. The testing time is too long for DRAM fabrication. Moreover, the number of registers required for the fine-tuning terminals in the bypass gate circuit is large, which will occupy the footprint of DRAM.

SUMMARY

The implementations of the disclosure provide a power supply circuit, a memory, a testing device, a memory system and an electronic device, which intend to reduce the testing time of chips such as memories and reduce the occupied footprint of the memory.

To achieve the above objects, the implementations of the disclosure utilize the technologies discussed below.

In a first aspect, there is provided a power supply circuit, comprising a voltage adjusting circuit and an oscillation circuit. A first voltage output terminal of the voltage adjusting circuit can be coupled with a power supply input terminal of a delay chain circuit in a memory. The first voltage output terminal of the voltage adjusting circuit can be coupled with a power supply input terminal of the oscillation circuit. The voltage adjusting circuit can be configured to output a first voltage to the delay chain circuit and the oscillation circuit via the first voltage output terminal. The oscillation circuit can be configured to generate a clock signal corresponding to the first voltage. The voltage adjusting circuit can be further configured to receive an adjusting signal for adjusting the first voltage.

According to the disclosure, since the clock signal generated by the oscillation circuit changes with the change of the first voltage generated by the voltage adjusting circuit, the first voltage generated by the voltage adjusting circuit may be adjusted accordingly when the power supply circuit adjusts, using the adjusting signal, the clock signal generated by the oscillation circuit. In this way, the required delay of the delay chain circuit may be implemented by adjusting the power supply voltage for supplying power to the delay chain circuit. Compared with the prior art, the disclosure may eliminate the need of the fine-tuning control by the fine-tuning control terminals of the bypass gate circuit in the delay chain circuit, saving the memory footprint otherwise occupied by the registers required by the fine-tuning control terminals in the bypass gate. Moreover, the disclosure may be implemented in a relatively simply way through controlling the delay of the delay chain circuit by changing the power supply voltage to the delay chain circuit, improving the efficiency of the memory testing.

In some implementations, the adjusting signal can be determined based on a frequency of the clock signal. It may be considered in such implementations that a range of process corners may correspond to a first voltage, and the frequency of the clock signal of the oscillation circuit may reflect the first voltage when the first voltage also supplies power to the oscillation circuit. Therefore, the adjusting signal may be determined based on the frequency of the clock signal, so as to adjust the first voltage. In some implementations, the voltage adjusting circuit can include a first adjustable circuit and a second adjustable circuit. In an implementation, the first adjustable circuit can include a first voltage input terminal and a second voltage output terminal, the second adjustable circuit can include a second voltage input terminal, a third voltage input terminal and the first voltage output terminal, the second voltage output terminal can be coupled with the third voltage input terminal, and the first voltage input terminal and the second voltage input terminal can be configured to receive a power supply voltage signal of the memory. The adjusting signal can include a first adjusting signal and a second adjusting signal. The first adjustable circuit can be configured to output, based on the first adjusting signal, a reference voltage signal to the third voltage input terminal of the second adjustable circuit via the second voltage output terminal. The second adjustable circuit can be configured to output the first voltage based on the reference voltage signal and the second adjusting signal.

It may be understood that the above first adjustable circuit may be used to implement a fine voltage adjustment to obtain the reference voltage signal to be output to the second adjustable circuit. It may be understood that the second adjustable circuit may be used for signal amplification to implement a coarse voltage adjustment to obtain the first voltage. In this way, the voltage adjusting precision may be improved using such a two-stage adjustable circuit.

In some implementations, the first adjustable circuit can include a first adjustable resistor configured to adjust the reference voltage signal. The second adjustable circuit can include a second adjustable resistor configured to adjust the first voltage.

In any adjustable circuit of the above two-stage adjustable circuit, the voltage adjustment may be made using the adjustable resistors in the adjustable circuits. Of course, this design is just an example, and the disclosure may implement the two-stage adjustable circuits in other ways.

In some implementations, the first adjustable resistor can include a plurality of resistors connected in series and a plurality of switches each connected in parallel with a corresponding one of the plurality of resistors. The first adjustable circuit can be configured to receive the first adjusting signal, which is used to control to close or open the switches corresponding to some of the plurality of resistors connected in series in the first adjustable resistor.

In this way, the resistance value of the first adjustable resistor may be increased by opening the switches corresponding to an increased number of resistors, and may be decreased by closing the switches corresponding to an increased number of resistors. In this way, the adjustment of the reference voltage signal may be made only by opening or closing a certain number of switches in the first adjustable resistor, making the voltage adjustment relatively simple.

In some implementations, the second adjustable resistor can include a plurality of resistors connected in series and a plurality of switches each connected in parallel with a corresponding one of the plurality of resistor. The second adjustable circuit can be configured to receive the second adjusting signal, which is used to control to close or open the switches corresponding to some of the plurality of resistors connected in series in the second adjustable resistor.

Similar to the first adjustable resistor, the second adjustable resistor may have its resistance value being increased by opening the switches corresponding to an increased number of resistors and being decreased by closing the switches corresponding to an increased number of resistors. In this way, the adjustment of the first voltage may be made only by opening or closing a certain number of switches in the second adjustable resistor, making the voltage adjustment relatively simple.

In a second aspect, there is provided a power supply method, which may be applied to a power supply circuit. For example, the power supply circuit can be configured to supply power to a delay chain circuit in a memory and include a voltage adjusting circuit and an oscillation circuit. A first voltage output terminal of the voltage adjusting circuit can be coupled with a power supply input terminal of a delay chain circuit in a memory. The first voltage output terminal of the voltage adjusting circuit can be coupled with a power supply input terminal of the oscillation circuit. The voltage adjusting circuit can be configured to output a first voltage to the delay chain circuit and the oscillation circuit via the first voltage output terminal. The oscillation circuit can be configured to generate a clock signal corresponding to the first voltage. The voltage adjusting circuit can be further configured to receive an adjusting signal for adjusting the first voltage. For example, the method can include: generating a clock signal corresponding to a first voltage, wherein the first voltage is to be output to a delay chain circuit; receiving an adjusting signal; and adjusting the first voltage based on the adjusting signal.

By applying the power supply method in the second aspect to the above power supply circuit, the beneficial effects of the second aspect may be similar to those discussed in the first aspect.

In some implementations, the adjusting signal can include a first adjusting signal and a second adjusting signal. The first voltage can be adjusted based on the adjusting signal by outputting a reference voltage based on the first adjusting signal and outputting the first voltage based on the reference voltage and the second adjusting signal.

In a third aspect, there is provided a memory. For example, the memory can include a power supply circuit. For example, the power supply circuit can be configured to supply power to a delay chain circuit in a memory and include a voltage adjusting circuit and an oscillation circuit. A first voltage output terminal of the voltage adjusting circuit can be coupled with a power supply input terminal of a delay chain circuit in a memory. The first voltage output terminal of the voltage adjusting circuit can be coupled with a power supply input terminal of the oscillation circuit. The voltage adjusting circuit can be configured to output a first voltage to the delay chain circuit and the oscillation circuit via the first voltage output terminal. The oscillation circuit can be configured to generate a clock signal corresponding to the first voltage. The voltage adjusting circuit can be further configured to receive an adjusting signal for adjusting the first voltage. The memory can further include a delay chain circuit having a power supply input terminal coupled with a first voltage output terminal of the power supply circuit and configured to receive a first voltage output from the first voltage output terminal of the power supply circuit, and a memory array having an input terminal coupled with an output terminal of the delay chain circuit and configured to receive a control signal output from an output terminal of the delay chain circuit.

In this way, by including the above power supply circuit in the memory, the memory of the disclosure may achieve the same beneficial effects as the power supply circuit.

In some implementations, the delay chain circuit comprises at least one set of delay units and a bypass circuit coupled with the at least one set of delay units.

In an implementation, the bypass circuit in the delay chain circuit may be used to control a number of delay units through which a control signal passes. The fine-tuning control terminals in the delay chain circuit may be used to implement the delay of signals sent to the memory array. However, with the method for implement the delay using voltage adjustment in the disclosure, the delay chain circuit may retain a reduced number of fine-tuning control terminals.

In some implementations, the delay chain circuit can include a plurality of delay units. It may be considered that the implementations remove the bypass circuit in the delay chain circuit, include a reduced number of delay units, and implement the delay of the delay chain circuit based only on the power supply voltage for supplying power to the delay chain circuit.

It is to be understood that the beneficial effects of the method and the memory related to the power supply circuit provided by the above implementations of the disclosure may be similar to those of the power supply circuit discussed above, and will not be repeated here.

BRIEF DESCRIPTION OF THE DRAWINGS

Drawings required by some implementations of the disclosure are briefly introduced below for the purpose of more clearly describing the technologies in the disclosure. Obviously, the drawings below are only those for some implementations of the disclosure. For those skilled in the art, other drawings may be obtained from these drawings. In addition, it is to be understood that the drawings for the following description are only a schematic diagram, and not intended to limit the actual size of the products, the actual flow of the methods, the actual timing of the signals, and the like in the implementations of the disclosure.

DETAILED DESCRIPTION

Figure 1:
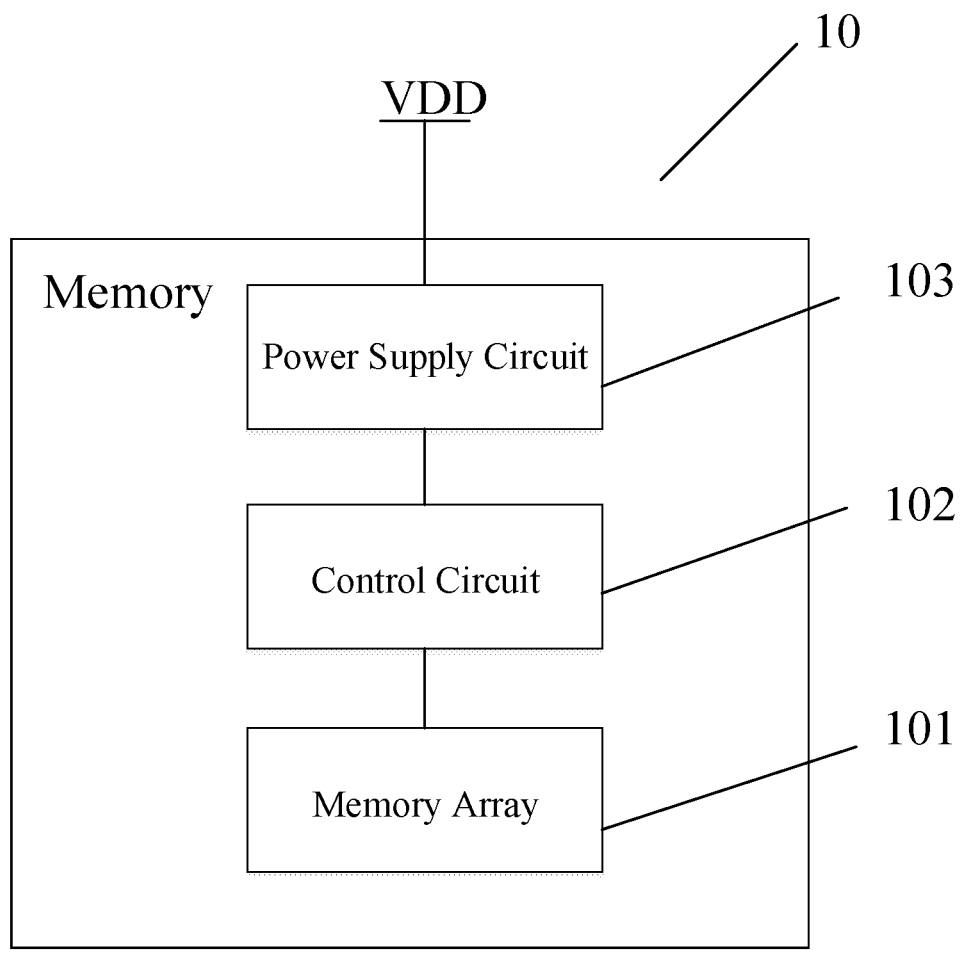
FIG. 1 is a functional block diagram of a memory according to the disclosure.

The following will provide a clear and complete description of the technologies in some implementations of the disclosure in connection with the accompanying drawings. Obviously, the presented implementations are only a part of the implementations of the disclosure, not all of them. All other implementations obtained by a person having ordinary skill in the art from the implementations in the disclosure will fall into the scope of the disclosure.

In the disclosure, it is to be appreciated that the terms "in", "out" and the like indicate an orientation or position relationship based on the orientation or position relationship illustrated in the drawings, which is only for the convenience of describing the disclosure in an simply way, no intended to indicate or imply that the involved device or element must have a specific orientation, be constructed and operated in a specific orientation, so it shall not be understood as a limitation on the scope of the disclosure.

Throughout the description and claims, the term "include(s)/including", "comprise(s)/comprising" and the like shall be interpreted in an open and inclusive manner, i.e., "including, but not limited to", unless specifically stated otherwise. In the description, the terms "one implementation", "some implementations", "exemplary implementations", "exemplary", or "some examples" and the like are intended to indicate that specific features, structures, materials, or characteristics related to the implementation or example may be included in at least one implementation or example of the disclosure. The above terms are not necessarily indicative of the same implementation or example. In addition, the specific features, structures, materials, or characteristics may be included in any one or more implementations or examples in any suitable manner.

Hereinafter, the terms "first", "second" and the like are only used for the purposes of illustration and shall not be understood as indicating or implying relative importance or implicitly indicating the number of indicated technical features. Thus, a feature defined with "first" or "second" and the like may explicitly or implicitly include one or more said feature. In implementations of the disclosure, the term "multiple/a plurality of" means two or more, unless specifically stated otherwise.

In some implementations, the terms "couple" and "connect" and their derivatives may be used. In some implementations, for example, the term "connection" may be used to indicate that two or more components are directly physically or electrically contacted with each other. In some implementations, for example, the term "couple" may be used to indicate that two or more components are directly physically or electrically contacted with each other. However, the term "couple" may also indicate that two or more components are not directly contacted with each other, but still cooperate or interact with each other. The implementations disclosed herein are not necessarily limited to the description herein.

A phrase "at least one of A, B and C" has the same meaning as "at least one of A, B or C", and both may include the following combinations of A, B and C: only A, only B, only C, a combination of A and B, a combination of A and C, a combination of B and C, and a combination of A, B and C.

A phrase "A and/or B" may include the following three combinations: only A, only B, and the combination of A and B.

The use of "applicable to" or "configured to" herein means open and inclusive language, which does not exclude devices applicable to or configured to perform additional tasks or steps.

In addition, a phrase "based on" herein means open and inclusive language, because a process, step, calculation or other action "based on" one or more conditions or values may be further based on additional conditions or values other than said values in practice.

Hereinafter, the disclosure will be described by referring to examples of implementations explained with reference to the accompanying drawings.

FIG. 1 shows a functional block diagram of a memory 10 according to an implementation of the disclosure.

The memory 10 may be a volatile memory such as a Dynamic Random Access Memory (DRAM) or a Static Random-Access Memory (SRAM) device, a nonvolatile memory device such as a Re-random Access Memory (Re-RAM), Electrically Erasable Programmable Read-Only Memory (EEPROM), Flash memory (also may be considered as a subset of EEPROMs), Ferromagnetic Random Access Memory (FRAM), Magnetic Random Access Memory (MRAM), and other semiconductor devices having capability of storing information. Each type of memory device may have a different configuration.

The memory 10 may include a memory array 101, a control circuit 102, and a power supply circuit 103.

The power supply circuit 103 may be provided with a power supply voltage by a power supply device external to the memory 10, and the power supply circuit 103 may in turn supply power to the control circuit 102 so that the control circuit 102 may send control signals to the memory array 101.

In response to the signals received from the control circuit 102, the memory array 101 may perform operations such as writing, reading, and erasing data. In some implementations, the memory array 101 may include a plurality of memory strings, each of which may include a plurality of memory units, and memory units of each memory string are connected in series.

In an example where the memory is a DRAM, the DRAM addresses rows and columns to access data according to delay parameters (timing parameters). As an example, the delay parameters may include Row Recharge (tRP) time and RAS to CAS Delay (tRCD) time. Here, the tRP time may be considered as the precharging time of a row address controller (Row Precharge Timing), or as a number of clock cycles required for precharging before the next memory cycle. The tRCD time is delay time for transitioning from the row addressing to the column addressing.

When a addressing request is triggered, the control circuit 102 in the DRAM first performs precharging according to the tRP, and then the DRAM initializes Row Address Strobe (RAS) for data addressing. Here, during the data addressing, the DRAM first addresses a row address, and then accesses an exact address of data using Column Address Strobe (CAS) after the tRCD time passes.

In some implementations, the delay parameters of the DRAM may also include tPre time, tRAS time, etc. These delay parameters may be used to control a number of clock cycles that the DRAM shall wait for to actually execute a data access instruction after receiving it. The smaller the delay parameters, the faster the memory. Of course, some memories cannot run at a low delay, which may lead to data loss.

Here, the tPre time may be understood as the precharging time.

The tRAS time may be understood as the smallest delay from the row active to the precharging (Active to Precharge Delay), or as the total time delay required from the beginning of the operation to the end of addressing when storing data in a row. If the tRAS time delay is too long, the performance of the DRAM may be degraded due to meaningless waiting. If the tRAS time delay is too short, an activated row address may be caused to enter an inactive state too early, which may result in that a burst transmission of data cannot be completed due to insufficient time.

In some implementations, the delay of the above DRAM delay parameters may be implemented by the delay chain circuit in the control circuit 102, that is, the delay parameters of the DRAM may be mainly determined by the delay chain circuit. Therefore, in the fabrication of DRAM chips, it is important to control the delay of the delay chain circuit. Here, different delay parameters of the DRAM may be implemented by the delays of different delay chain circuits.

Figure 2:
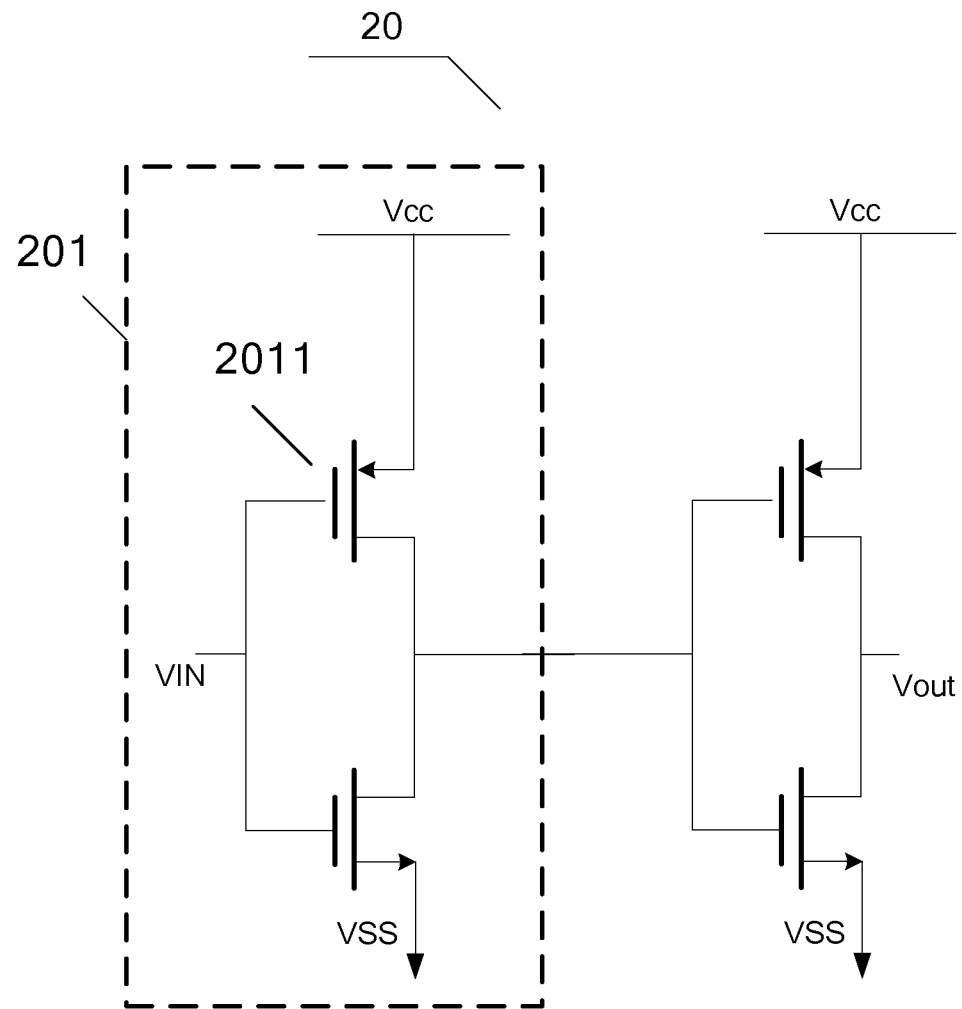
FIG. 2 is a circuit diagram of a delay chain circuit according to the disclosure.

The delay chain circuit is first introduced here. A delay chain circuit may be implemented by connecting smaller delay units and a bypass circuit. Each delay unit may be used to generate a delayed control signal with a phase difference from the initial control signal. As an example, FIG. 2 shows a circuit diagram of a delay chain circuit 20 including two delay units 201 coupled in series. Referring to FIG. 2, a single delay unit 201 may include two coupled transistors 2011. Here, Vcc represents a power supply voltage supplied by the power supply circuit 103 (shown in FIG. 1) to the delay unit 201, and Vss represents grounding. Vin represents an output voltage of the bypass circuit or a previous delay unit, and Vout represents an output voltage of the next delay unit.

Figure 3:
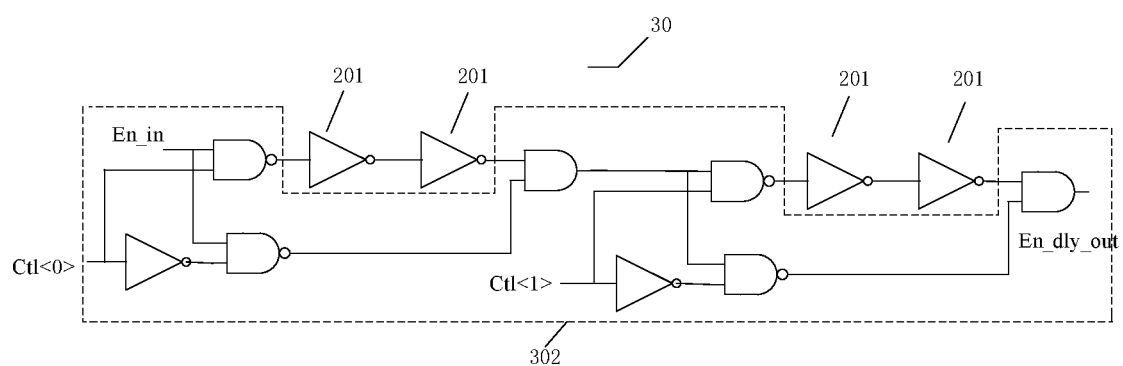
FIG. 3 is a circuit diagram of a delay chain circuit according to the disclosure.

FIG. 3 shows a circuit diagram of a delay chain circuit 30, based on the description with respect to the delay unit 201 in FIG. 2. The delay chain circuit 30 includes four delay units 201 and a bypass circuit 302 (shown in the dotted line box. The bypass circuit 302 may control a number of delay units 201 through which a control signal received by the delay chain circuit 30 passes. En_in shown in FIG. 3 may be considered as an input signal input into to the delay chain circuit 30 by a control signal corresponding to a delay parameter, and En_dly_out may be considered as an output signal when the control signal is output from the delay chain circuit 30.

Figure 4:
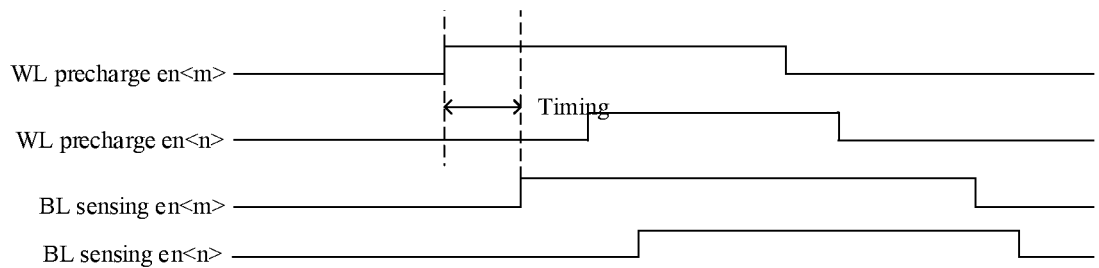
FIG. 4 is a timing chart for implementing the delay by the delay chain according to the disclosure.

The control signals En_in and En_dly_out will be further described with reference to FIG. 4. As an example, FIG. 4 shows a timing chart for implementing different delays by the delay chain circuit. It may be understood that each memory unit in the memory array 101 may be addressed based on an intersection of a bit line (BL) and a word line (WL). The word line is used to address a row address, and the bit line is used to address a column address. In an example of tRP, the time from a rising edge of the control signal "WL_precharge.en<m>" to a rising edge of "BL_sensing.en<m>" in FIG. 4 may be considered as the timing tRP from the beginning time of the WL precharge control signal for the m-th row to the beginning time of the BL sensing control signal for the m-th row.

With continued reference to FIG. 3, for example, the number of delay units 201 through which a control signal passes may be controlled by the bypass circuit 302 based on fine-tuning control terminals Ctl< > shown in FIG. 3. As an example, assuming two fine-tuning control terminals, two bits are required to indicate the level of the fine-tuning control terminals. When the bits of fine-tuning control terminals Ctl<0> and Ctl<1> are both 0, i.e., Ctl<1:0>=00, the bypass circuit 302 may make the control signal En_dly_out not pass any of the four delay units 201, and at that time, the control signal may be output from the delay chain circuit 30 with the smallest delay time. When the bits of the fine-tuning control terminals Ctl<0> and Ctl<1> are both 1, i.e., Ctl<1:0>=11, the bypass circuit 302 may make the control signal En_dly_out pass through all of the four delay units 201, and at that time, the control signal may be output from the delay chain circuit 30 with the largest delay time. It may be understood that the delay of the delay chain circuit 30 may be controlled by the number of delay units through which a control signal passes in the delay chain circuit 30, and the shorter the number of delay units 201 through which the control signal passes, the shorter the delay of the d elay chain circuit 30 may implement.

However, in some implementations, ranges of process corners corresponding to delay chain circuits 30 on different wafers may be different.

Here, all the differences in the ranges of process corners may be considered as different ranges of process corners due to different positions on the same wafer or deviations of the parameters of transistors on wafers among different batches of wafers caused by the differences among processes during the fabrication of semiconductor devices. Generally, processes may be divided into typical (tt), fast NMOS fast PMOS (ff), fast NMOS slow PMOS (fs), slow NMOS fast PMOS (sf) and slow NMOS slow PMOS (ss).

In view of the above, the performance of the delay units 201 in the delay chain circuit 30 may likely affected by the change of a corner-in-process of the process corners in different ranges of process corners. Therefore, by considering that there may be deviations among the processes for etching wafers of transistors during the fabrication, such as differences among threshold voltages of transistors, differences among channel lengths of transistors and differences among resistances and capacitances caused by different interconnects, it is necessary to take the process deviations into account in designing delay chain circuits in chips such as memory, so that the delay chain circuits may achieve the required delay parameters at various process corners in the chip design stage. Only in this way can the final chip be reliable. Therefore, it is required to test each DRAM chip during the fabrication. For example, the delay of the delay chain circuit 30 may be tuned using the above fine-tuning control terminals Ctl< > to achieve different delay parameters, as described above.

However, in the current DRAM chip testing methods in which the delay of the delay chain circuit 30 is tuned by the bypass circuit 302, it is generally needed to control the delay tuning of the delay chain circuit 30 using the fine-tuning terminals after a DRAM chip has been fabricated, which leads to a long chip testing time and thus adversely affects the chip testing and fabricating efficiency. Furthermore, when bits for the fine-tuning terminals of a delay chain circuit 30 are determined, it is required to store the bits corresponding to the fine-tuning terminals in registers of the chip. When the number of delay units 201 in the delay chain circuit 30 is large, the number of registers required by the chip is large and footprint of the chip occupied by the registers is large.

In view of above, some implementations of the disclosure provide a design for a power supply circuit for a delay chain circuit in a chip such as a memory, in which the power supply voltage of the delay chain circuit may be adjusted to achieve different delays of the delay chain circuit corresponding to different delay parameters after the chip has been fabricated. For any delay chain circuit with a fixed length, the delay of the delay chain circuit may change as a power supply voltage for supplying power to devices, such as transistors, in the delay chain circuit changes. As a result, in order to implement the delay of the delay chain circuit in different ranges of process corners, different delays may be implemented by adjusting the power supply voltage of the delay chain circuit. Compared with implementing different delays of the delay chain using fine-tuning control terminals in the prior art, the disclosure provides a method for adjusting the power supply voltage, which may provide different power supply voltages to the delay chain circuit in different ranges of process corners so as to achieve different delay parameters corresponding to different ranges of process corners. In such a manner, the chip testing is relatively simple, the chip testing efficiency is improved, and relatively less registers are required for saving the footprint.

Figure 5:
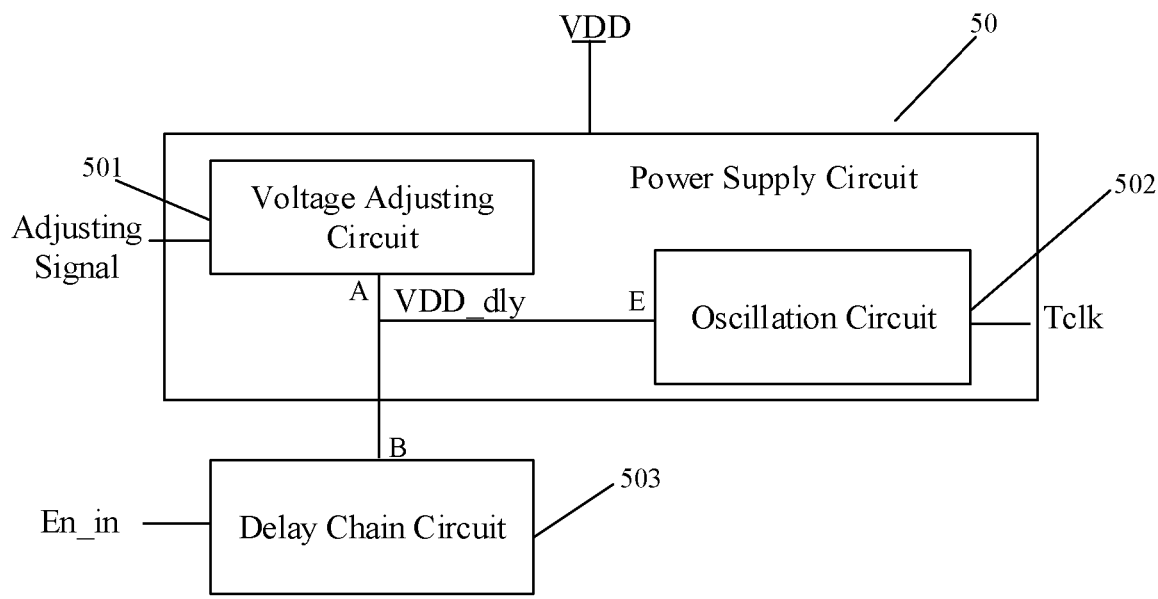
FIG. 5 is a functional block diagram of a power supply circuit according to the disclosure.

A power supply circuit of a delay chain circuit of the disclosure is described below. FIG. 5 shows a functional block diagram of a power supply circuit 50.

The power supply circuit 50 includes a voltage adjusting circuit 501 and an oscillation circuit 502.

A first voltage output terminal "A" of the voltage adjusting circuit 501 is coupled with a power supply input terminal "B" of a delay chain circuit 503 in a memory, and the first voltage output terminal "A" of the voltage adjusting circuit 501 is also coupled with a power supply input terminal "E" of the oscillation circuit 502.

As an example, the power supply circuit 50 may be included in a power supply circuit in a chip such as a memory, and the delay chain circuit 503 may be included in a control circuit in a chip such as a memory.

Here, the voltage adjusting circuit 501 is configured to output a first voltage VDD_dly to the delay chain circuit 503 and the oscillation circuit 502 via the first voltage output terminal "A".

The oscillation circuit 502 is configured to generate a clock signal Tclk corresponding to the first voltage VDD_dly. In other words, the oscillation circuit 502 may generate the clock signal Tclk for indicating the first voltage VDD_dly.

The voltage adjusting circuit 501 is further configured to receive an adjusting signal for adjusting the first voltage VDD_dly.

Here, the VDD may be considered as a power supply voltage supplied to the chip by a power supply device external to the chip to which the power supply circuit 50 belongs. The power supply voltage VDD supplied to the on-chip power supply circuit 50 by the off-chip power supply device is constant in the same range of process corners. The power supply voltage VDD of the power supply circuit 50 in FIG. 5 may be equivalent to the power supply voltage Vcc shown in FIG. 2, i.e., the power supply voltage VDD being constant.

For example, during chip testing, an off-chip testing device may determine an adjusting signal to be output to the voltage adjusting circuit 501 based on whether a frequency of the clock signal Tclk indicating the first voltage VDD_dly reaches a target clock frequency, so that the voltage adjusting circuit 501 may adjust the first voltage VDD_dly based on the received adjusting signal.

The reasons for adjusting the first voltage VDD_dly based on whether the frequency of the clock signal Tclk reaches the target clock frequency include that the delay parameters corresponding to the delay chain circuit 503 are different in different ranges of process corners, and the delay of the delay chain circuit 503 may be implemented using the first voltage VDD_dly for supplying power to the delay chain circuit 503. For example, the higher the value of the first voltage VDD_dly, the smaller the delay. Moreover, when the first voltage VDD_dly is also used to supply power to the oscillation circuit 502 at the same time, the frequency of the clock signal Tclk output by the oscillation circuit 502 may reflect the first voltage VDD_dly. According to the disclosure, therefore, the first voltage VDD_dly supplying power to the delay chain circuit 503 may be adjusted by the testing device based on the frequency of the clock signal Tclk output by the oscillation circuit 502 so as to implement the delays of the delay chain circuit in different ranges of process corners.

Compared with the prior art, the delay chain circuit 503 are supplied with power by the adjusted first voltage VDD_dly in the implementations of the disclosure, rather than the off-chip power supply voltage VDD. According to the implementations of the disclosure, it is no longer required to use multiple fine-tuning control terminals to control the number of delay units 201 in the delay chain circuit 503 through which the control signal passes. With a delay chain circuit corresponding to delay parameters, the delay of the delay chain circuit 503 may be implemented using the on-chip power supply circuit 50, which may shorten the chip testing time and reduce the chip footprint occupied by the registers required to store bit values for the fine-tuning control terminals.

In some implementations of the disclosure, the testing device may adjust the voltage of the power supply circuit 50 in a chip such as a memory after the chip has been fabricated.

Figure 6:
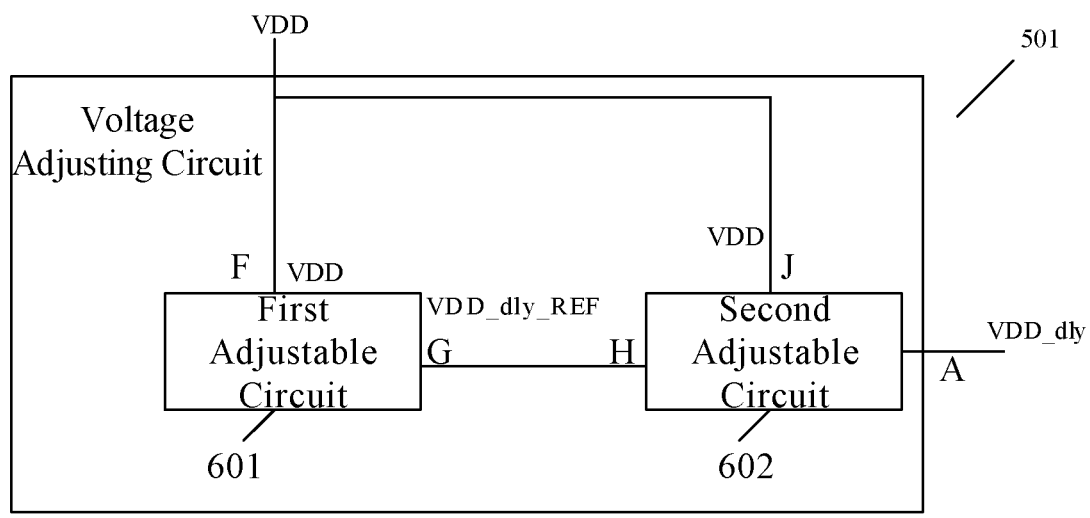
FIG. 6 is a functional block diagram of a voltage adjusting circuit according to the disclosure.

FIG. 6 shows a functional block diagram of a voltage adjusting circuit 501 according to an implementation of the disclosure. The voltage adjusting circuit 501 includes a first adjustable circuit 601 and a second adjustable circuit 602.

In an implementation, the first adjustable circuit 601 includes a first voltage input terminal "F" and a second voltage output terminal "G", and the second adjustable circuit 602 includes a second voltage input terminal "J", a third voltage input terminal "H" and a first voltage output terminal "A". The second voltage output terminal "G" is coupled with the third voltage input terminal "H", and the first voltage input terminal "F" and the second voltage input terminal "J" are configured to receive a power supply voltage VDD of a memory 70.

In some implementations of the disclosure, the adjusting signal includes a first adjusting signal and a second adjusting signal.

The first adjustable circuit 601 is configured to output a reference voltage signal VDD_dly_REF based on the first adjusting signal, wherein the reference voltage signal VDD_dly_REF is output, via the second voltage output terminal "G", to the third voltage input terminal "H" of the second adjustable circuit 602.

The second adjustable circuit 602 is configured to output a first voltage VDD_dly based on the reference voltage signal VDD_dly_REF and the second adjusting signal.

For example, the first adjustable circuit 601 may be a voltage adjusting circuit that may perform a fine adjustment, e.g., in units of 2 mv, based on the first adjusting signal, and output the reference voltage signal VDD_dly_REF. The second adjustable circuit 602 may be a voltage amplification circuit, which may perform a coarse voltage adjustment, e.g., in units of 50 mv, based on the second adjusting signal, and output the first voltage VDD_dly via the first voltage output terminal "A" of the second adjustable circuit 602.

Figure 7:
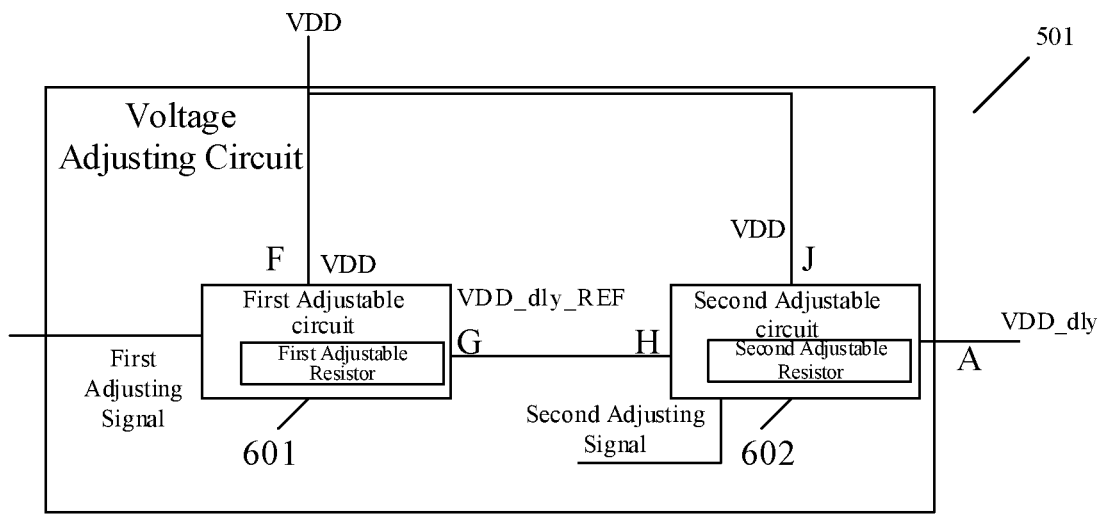
FIG. 7 is a functional block diagram of a voltage adjusting circuit according to the disclosure.

In view of the above, FIG. 7 shows a functional block diagram of a voltage adjusting circuit 501, based on the first adjustable circuit 601 and the second adjustable circuit 602 discussed above, according to some implementations of the disclosure. That is, in some implementations of the disclosure, the first adjustable circuit 601 may include a first adjustable resistor configured to adjust the reference voltage signal VDD_dly_REF output by the first adjustable circuit 601, and the second adjustable circuit 602 may include a second adjustable resistor configured to adjust the first voltage VDD_dly output by the second adjustable circuit 602.

Figure 8:
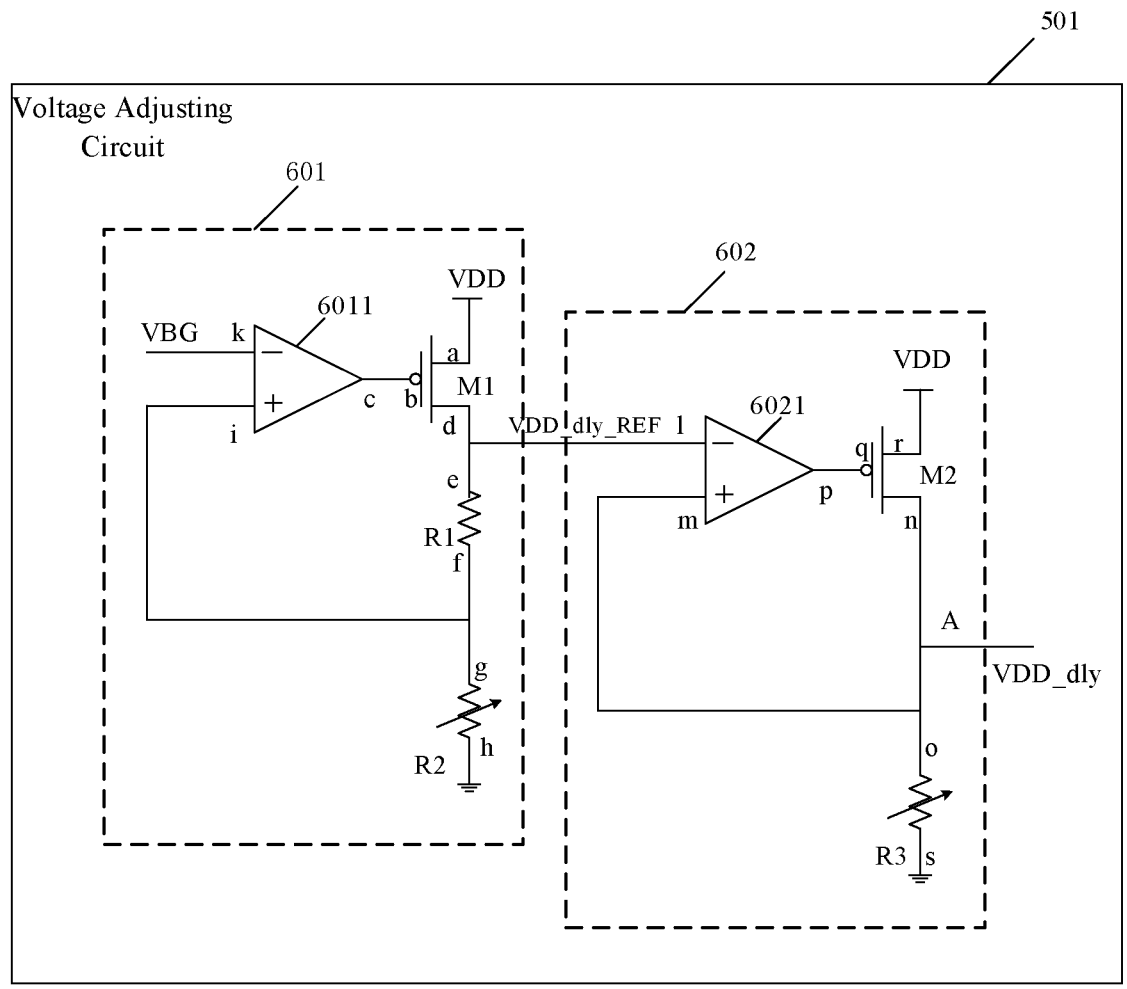
FIG. 8 is a circuit diagram of a voltage adjusting circuit according to the disclosure.

FIG. 8 is a circuit diagram of a voltage adjusting circuit 501, based on the first adjustable circuit 601 and the second adjustable circuit 602 shown in FIG. 7, according to the disclosure.

Referring to FIG. 8, the first adjustable circuit 601 includes a first comparator 6011, a first switching device M1, a first resistor R1, and a first adjustable resistor R2. A first terminal "a" of the first switching device M1 is configured to receive a power supply voltage signal VDD of the memory, a second terminal "b" of the first switching device M1 is coupled with an output terminal "c" of the first comparator 6011, a third terminal "d" of the first switching device M1 is coupled with a first terminal "e" of the first resistor R1, a second terminal "f" of the first resistor R1 is coupled with a first terminal "g" of the first adjustable resistor R2, a second terminal "h" of the first adjustable resistor R2 is grounded, a positive input terminal "i" of the first comparator 6011 is coupled between the second terminal "f" of the first resistor R1 and the first terminal "g" of the first adjustable resistor R2, and an inverting input terminal "k" of the first comparator 6011 is configured to receive a reference voltage VBG.

In some implementations, the reference voltage VBG may be provided by a reference voltage source in an on-chip power supply circuit.

The second adjustable circuit 602 includes a second comparator 6021, a second switching device M2 and a second adjustable resistor R3. An inverting input terminal "l" of the second comparator 6021 is coupled between a third terminal "d" of the first switching device M1 and a first terminal "e" of the first resistor R1, a positive input terminal "m" of the second comparator 6021 is coupled between a first terminal "n" of the second switching device M2 and a first terminal "o" of the second adjustable resistor R3, an output terminal "p" of the second comparator 6021 is coupled with a second terminal "q" of the second switching device M2, a third terminal "r" of the second switching device M2 is configured to receive a power supply voltage signal VDD of the memory, a second terminal "s" of the second adjustable resistor R3 is grounded, and a first voltage output terminal "A" is coupled between the first terminal "n" of the second switching device M2 and the first terminal "o" of the second adjustable resistor R3.

In some implementations of the disclosure, the first adjustable resistor R2 includes a plurality of resistors connected in series and a plurality of switches each connected in parallel with a corresponding one of the resistors.

In view of the above, the first adjustable circuit 601 may be configured to receive a first adjusting signal, which is used to control to open or close the switches corresponding to some of the plurality of resistors connected in series in the first adjustable resistor R2.

Similar to the first adjustable circuit 601, the second adjustable resistor R3 includes a plurality of resistors connected in series and a plurality of switches each connected in parallel with a corresponding one of the resistors.

The second adjustable circuit 602 may be configured to receive a second adjusting signal which is used to control to open or close the switches corresponding to some of the plurality of resistors connected in series in the second adjustable resistor R3.

Thus, considering the first adjustable circuit 601 for example, when the first adjusting signal is used to decrease a resistance value of the first adjustable resistor R2, a number of switches closed in the first adjustable resistor R2 increases, and a value of the reference voltage signal VDD_dly_REF output by the first adjustable circuit 601 decreases accordingly. On the contrary, when the first adjusting signal is used to increase the resistance value of the first adjustable resistor R2, a number of opened switches in the first adjustable resistor R2 increases, and the value of the reference voltage signal VDD_dly_REF output by the first adjustable circuit 601 increases accordingly.

Considering the second adjustable circuit 602, the implementation of which is similar to that of the first adjustable circuit 601, when the second adjusting signal is used to decrease a resistance value of the second adjustable resistor R3, a number of closed switches in the second adjustable resistor R3 increases, and the first voltage VDD_dly output by the second adjustable circuit 602 decreases accordingly. When the second adjusting signal is used to increase the resistance value of the second adjustable resistor R3, a number of opened switches in the second adjustable resistor R3 increases, and the first voltage VDD_dly output by the second adjustable circuit 602 increases accordingly.

Resistance values of the plurality of resistors connected in series in the first adjustable resistor R2 are equal to or proportional to each other, and resistance values of the plurality of resistors connected in series in the second adjustable resistor R3 are equal to or proportional to each other. The above adjustments made to the first adjustable resistor R2 and the second adjustable resistor R3 may be considered as linear adjustments. That is, the voltage value of the reference voltage signal VDD_dly_REF is proportional to the resistance value of the first adjustable resistor R2, and the first voltage VDD_dly is proportional to the resistance value of the second adjustable resistor R3. Of course, in some other implementations, the first adjustable resistor R2 may be adjusted in a non-linear manner with respect to the reference voltage signal VDD_dly_REF, and the second adjustable resistor R3 may be adjusted in a non-linear manner with respect to the first voltage VDD_dly.

For example, when the first adjusting signal is used to adjust the resistance value of the first adjustable resistor R2, the voltage value of the reference voltage signal VDD_dly_REF is changed in unit of Rmv. When the second adjusting signal is used to adjust the resistance value of the second adjustable resistor R3, the first voltage VDD_dly is changed in the units of Smv. Here, R and S are integers greater than 0, and S may be greater than R. That is, the first voltage VDD_dly may be adjusted in a larger step, and the resulted first voltage VDD_dly may supply power to the delay chain circuit 503 and the oscillation circuit 502.

Figure 9:
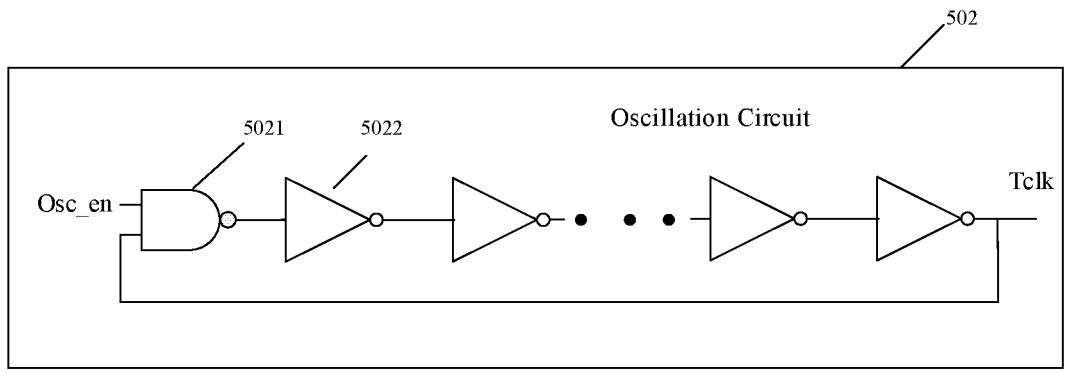
FIG. 9 is a circuit diagram of an oscillation circuit according to the disclosure.

In the implementations of the disclosure, the oscillation circuit 502 may be implemented in various ways. FIG. 9 shows a circuit diagram of an oscillation circuit 502 according to an implementation of the disclosure. As shown, the oscillation circuit 502 may include at least one NAND gate 5021 and an even number of inverters 5022 connected in series. Here, the signal Osc_en input at an input terminal of the NAND gate 5021 may be considered as a driving signal input to the oscillation circuit 502. For example, when a level of the Osc_en is high, the oscillation circuit 502 may be driven to oscillate with power supplied by the first voltage VDD_Dly, and output a clock signal Tclk to an off-chip testing device.

When the testing device detects that a frequency of the clock signal Tclk reaches a target clock frequency, the first voltage VDD_dly corresponding to the target clock frequency may be used to supply power to the delay chain circuit 503.

It may be understood that chips, on the wafers, in different ranges of process corners may correspond to different target clock frequencies, which may reflect the first voltages VDD_dly required by the delay chain circuits 503 on chips in different ranges of process corners.

Once the first voltages VDD_dly corresponding to the target clock frequencies are determined, the first voltages VDD_dly may be used to supply power to the delay chain circuits 503 corresponding to different delay parameters of the chips, respectively. To implement delays of the delay chains corresponding to different delay parameters, different delay chain circuits 503 may be used. For example, the delay chain circuits 503 may include different numbers of delay units 201.

In this way, compared with the prior art where different delays of delay chains corresponding to different delay parameters are implemented using fine-tuning control terminals in different delay chain circuits 503, the delay chain circuits 503 in the implementations of the disclosure can have their delays controlled without adjusting the fine-tuning control terminals. Rather, the delay of a delay chain circuit according to the disclosure may be implemented by adjusting a power supply voltage of the delay chain circuit 503. A result, the chip testing may be performed in an efficient way, and the testing time of the chips may be reduced. Further, the footprint occupied by the voltage adjusting circuit 501 and the oscillation circuit 502 on the chip is relatively smaller than that occupied by the registers.

Figure 10:
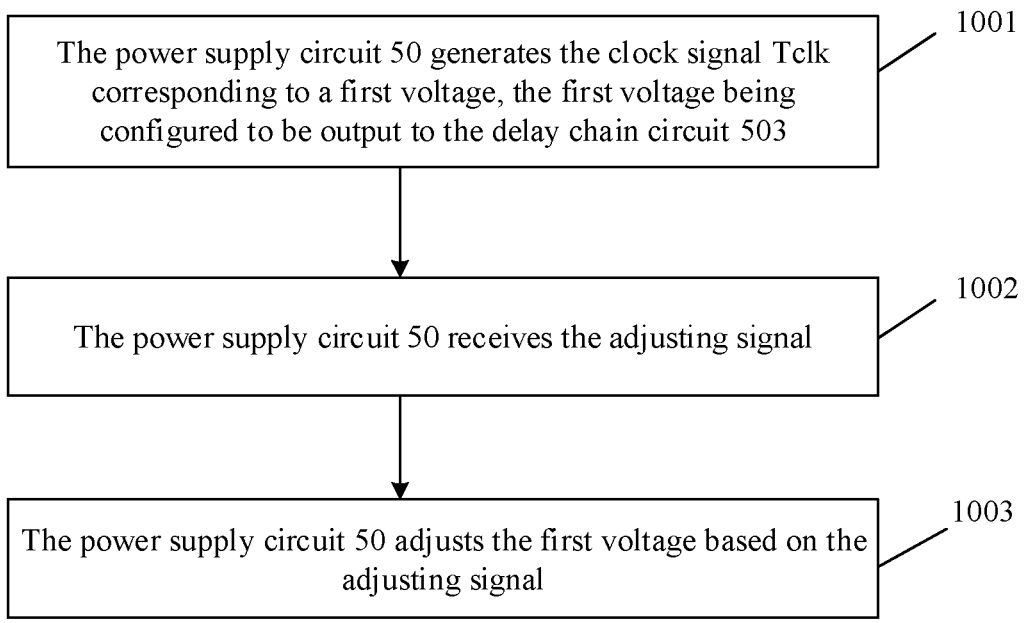
FIG. 10 is a flowchart of a power supply method according to an implementation of the disclosure.

In view of the above description of the power supply circuit 50 in the disclosure, the implementations of the disclosure also provide a power supply method corresponding to the power supply circuit 50. FIG. 10 is a flowchart of a power supply method according to an implementation of the disclosure. The method includes the steps 1001 to 1003.

At step 1001, the power supply circuit 50 generates the clock signal Tclk corresponding to a first voltage that is configured to be output to the delay chain circuit 503.

In some implementations, the power supply circuit 50 may generate the first voltage VDD_dly corresponding to the frequency of the clock signal Tclk output by the oscillation circuit 502. The first voltage is used to supply power to the delay chain circuit 503 and the oscillation circuit 502, which generates the clock signal. Step 1001 may be implemented by referring to the description with respect to the power supply circuit 50 in the above implementations. At step 1002, the power supply circuit 50 receives the adjusting signal.

In some implementations, the adjusting signal may be determined by an off-chip testing device based on whether the frequency of the received clock signal Tclk reaches the target clock frequency. Step 1002 may be implemented by referring to the description with respect to the power supply circuit 50 in the above implementations.

At step 1003, the power supply circuit 50 adjusts the first voltage based on the adjusting signal.

In an implementation, the power supply circuit 50 adjusts the first voltage VDD_dly based on the received adjusting signal output by the off-chip testing device.

As discussed with respect to the power supply circuit 50 in the above implementations, the step 1003 may include a first step at which the first adjustable circuit 601 outputs the reference voltage signal VDD_dly_REF based on the first adjusting signal, and a second step at which the second adjustable circuit 602 outputs the first voltage VDD_dly based on the second adjusting signal and the reference voltage signal VDD_dly_REF. The details may be found in the above description with respect to the power supply circuit 50.

Figure 11:
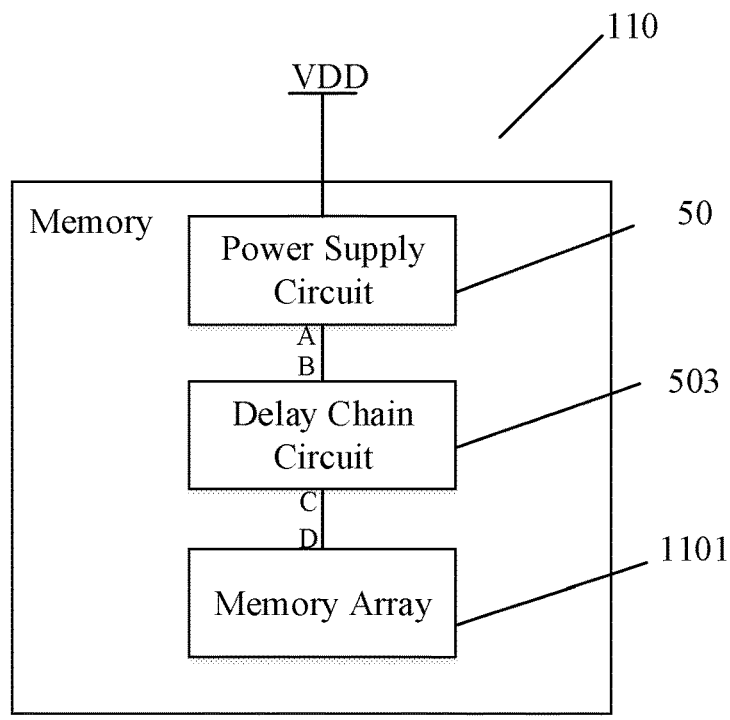
FIG. 11 is a functional block diagram of a memory according to an implementation of the disclosure.

FIG. 11 is a functional block diagram of a memory 110, based on the power supply circuit 50 in the above implementations, according to an implementation of the disclosure. The memory 110 includes a power supply circuit 50, a delay chain circuit 503, and a memory array 1101. In some implementations, the power supply circuit 50 and the delay chain circuit 503 may be considered as a part of peripheral circuits of the memory array 1101.

The power supply circuit 50 has been discussed above, and the description thereof is omitted here.

A power supply input terminal "B" of the delay chain circuit 503 is coupled with a first voltage output terminal "A" of the power supply circuit 50, and is configured to receive a first voltage output from the first voltage output terminal "A" of the power supply circuit 50.

An input terminal "D" of the memory array 1101 is coupled with an output terminal "C" of the delay chain circuit 503, and is configured to receive a control signal En_dly_output output from the output terminal "C" of the delay chain circuit 503.

In some implementations, the delay chain circuit 503 includes at least one set of delay units and a bypass circuit coupled to the at least one set of delay units. In an implementation, for a single set of delay units in the at least one set of delay units, the bypass circuit is configured to control whether a control signal En_in received by the delay chain circuit 503 passes through the single set of delay units and output, as an En_dly_ouput, to the memory array 1011.

It may be understood that in a delay chain circuit 503, a bypass circuit may be configured to control whether or not a control signal En_dly_out passes through a delay unit in the delay chain circuit 503. As mentioned above, the bypass circuit may generally use fine-tuning control terminals to control whether or not the control signal En_dly_out passes through a delay unit in the delay chain circuit 503. In some implementations of the disclosure, a number of delay units in the delay chain circuit 503 may be reduced compared with that in the prior art. In an implementation, some delay units and the corresponding fine-tuning control terminals may be omitted from the existing delay chain circuit, and other delay units and the corresponding fine-tuning control terminals in the existing delay chain circuit may be remained as the delay chain circuit 503. In such a scenario, the delay chain circuit 503 may be configured to output control signals with different delays to the memory array 1011 in different ranges of process corners.

In some implementations of the disclosure, the delay chain circuit 503 may not include the bypass circuit, and adjust the delay of the delay chain circuit 503 only based on the first voltage VDD_dly used to supply power to the delay chain circuit 503 by the power supply circuit 50. In such an implementation, the delay chain circuit 503 includes a plurality of delay units.

By including the above power supply circuit 50 in the memory 110, the memory 110 may achieve the same beneficial effects as the power supply circuit 50 does, which will not be repeated here.

Figure 12:
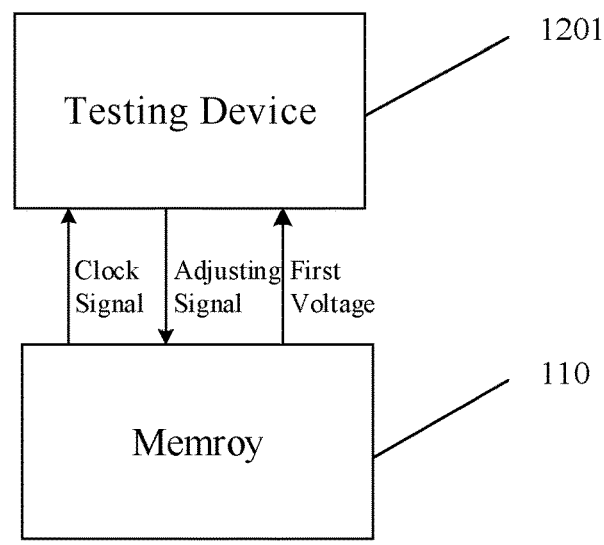
FIG. 12 is a functional block diagram of a testing device according to an implementation of the disclosure.

FIG. 12 is a functional block diagram of a testing device 1201 according to some implementations of the disclosure.

The testing device 1201 is coupled with a memory, e.g., the memory 110, and is configured to input an adjusting signal to the memory 110 based on a frequency of a clock signal that is output by the memory 110 and corresponds to a first voltage.

The memory 110 has been described above and the description thereof will not be repeated here.

Figure 13:
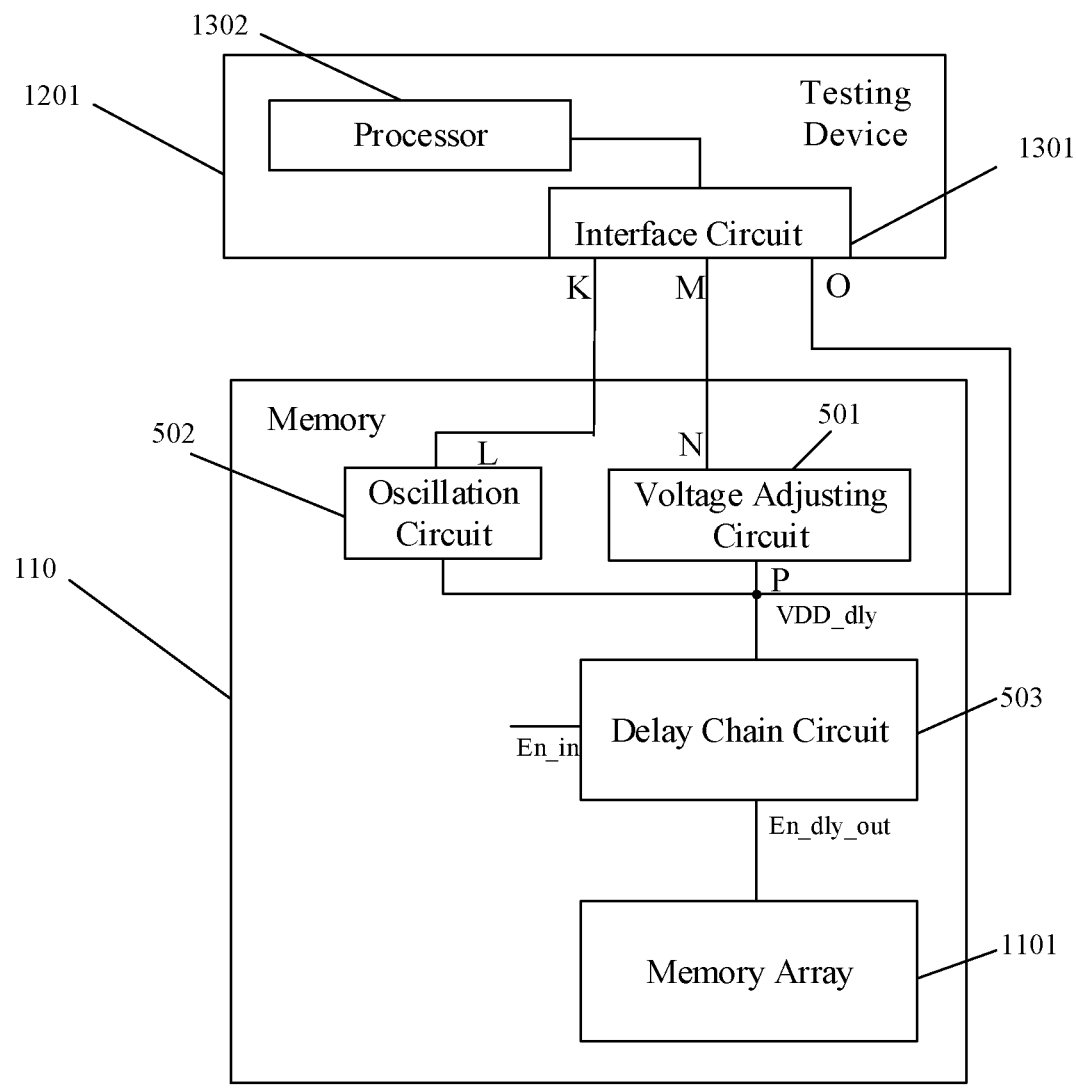
FIG. 13 is a functional block diagram of a testing device according to an implementation of the disclosure.

FIG. 13 is a functional block diagram illustrating the coupling of a testing device, e.g., the testing device 1201 shown in FIG. 12, and a memory, e.g., the memory 110, according to some implementations of the disclosure.

As shown in FIG. 13, the testing device 1201 includes an interface circuit 1301 and a processor 1302 coupled with each other. A first terminal "K" of the interface circuit 1301 is coupled with a clock output terminal "L" of the oscillation circuit 502 in the memory 110, a second terminal "M" of the interface circuit 1301 is coupled with an input terminal "N" of the voltage adjusting circuit 501 in the memory 110, and a third terminal "O" of the interface circuit 1301 is coupled with a first voltage output terminal "P" of the voltage adjusting circuit 501 in the memory 110.

As discussed above with respect to the power supply circuit 50, in some implementations of the disclosure, the testing device 1201 may adjust a first adjusting resistor R2 and a second adjusting resistor R3 in the voltage adjusting circuit 501 via the second terminal "M" of the interface circuit 1301, and obtain a target clock frequency accordingly by scanning and obtaining, via the first terminal "K" of the interface circuit 1301, a clock signal of the oscillation circuit 502. In an implementation, the interface circuit 1301 may be configured to receive, via the first terminal "K" of the interface circuit 1301, the clock signal output from the clock output terminal "L" of the oscillation circuit 502, and output the clock signal to the processor 1302. The processor 1302 may determine an adjusting signal based on a frequency of the clock signal, and output the adjusting signal to the first adjustment resistor R2 and the second adjustment resistor R3 in the voltage adjusting circuit 501 via the second terminal "M" of the interface circuit 1301. For example, the first terminal "N" of the voltage adjusting circuit 501 may be coupled with switches each connected in parallel with a corresponding one of a plurality of resistors in both of the first adjustable resistor R2 and the second adjustable resistor R3, and the interface circuit 1301 may output an instruction to open or close some of the switches coupled with the first terminal N based on address information of the switches indicated by the processor 1302.\

In an implementation, the testing device 1201 may further obtain, via the third terminal "O" of the interface circuit 1301, a first voltage VDD_dly output by the first voltage output terminal "P", so as to determine whether the first voltage VDD_dly is within a safe voltage threshold range.

Figure 14:
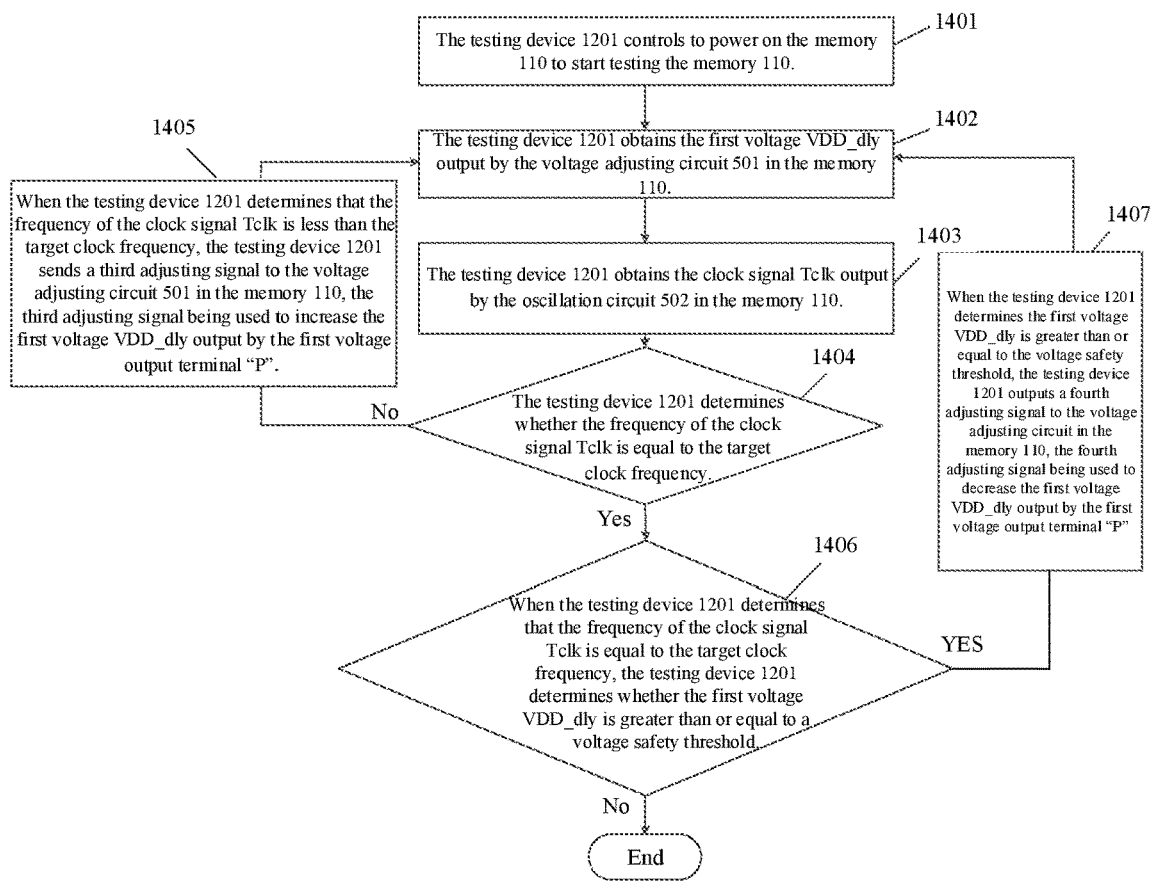
FIG. 14 is a flowchart of a memory testing method according to an implementation of the disclosure.

In view of the above description of the testing device 1201 in the disclosure, the implementations of the disclosure also provides a memory testing method. FIG. 14 is a flowchart of a memory testing method according to an implementation of the disclosure. The method includes the steps 1401 to 1407.

At step 1401, the testing device 1201 controls to power on the memory 110 to start testing the memory 110.

For example, the testing device 1201 may input an off-chip power supply voltage VDD to the voltage adjusting circuit 501 of the memory 110. Alternatively, a power supply device other than the testing device 1201 may input the off-chip power supply voltage VDD to the voltage adjusting circuit 501.

At step 1402, the testing device 1201 obtains the first voltage VDD_dly output by the voltage adjusting circuit 501 in the memory 110.

In an implementation, the testing device 1201 may obtain, via the third terminal "O" of the interface circuit 1301, the first voltage VDD_dly output by the first voltage output terminal "P" of the voltage adjusting circuit 501. The first voltage VDD_dly may be small initially, and and be adjusted to become larger as the testing proceeds.

At step 1403, the testing device 1201 obtains the clock signal Tclk output by the oscillation circuit 502 in the memory 110.

For example, the interface circuit 1301 is configured to receive, via the first terminal "K" of the interface circuit 1301, the clock signal Tclk output from the clock output terminal "L" of the oscillation circuit 502, and output the clock signal Tclk to the processor 1302.

At step 1404, the testing device 1201 determines whether the frequency of the clock signal Tclk is equal to the target clock frequency.

For example, the processor 1302 may obtain the frequency of the clock signal Tclk based on the clock signal Tclk received for a period of time, so as to determine whether the frequency of the clock signal Tclk reaches the target clock frequency in the range of process corners corresponding to the delay chain circuit 503 of the memory 110. The method proceeds to step 1405 when the testing device 1201 determines that the frequency of the clock signal Tclk is less than the target clock frequency, or proceeds to step 1406 when the testing device 1201 determines that the frequency of the clock signal Tclk is equal to the target clock frequency.

At step 1405, the testing device 1201 sends a third adjusting signal to the voltage adjusting circuit 501 in the memory 110, the third adjusting signal being used to increase the first voltage VDD_dly output by the first voltage output terminal "P".

For example, when the processor 1302 is configured to determine that the frequency of the clock signal Tclk is less than the target clock frequency, the third adjusting signal is output to the first terminal "N" of the voltage adjusting circuit 501 via the second terminal "M" of the interface circuit 1301.

When the first voltage VDD_dly is used to supply power to the oscillation circuit 502, the higher the first voltage VDD_dly, the higher the frequency of the clock signal Tclk. When the processor 1302 determines that the frequency of the clock signal Tclk is less than the target clock frequency, the processor 1302 may output the third adjusting signal to the first terminal "N" of voltage adjusting circuit 501 via the second terminal "M" of interface circuit 1301 so as to increase the first voltage VDD_dly output by the voltage adjusting circuit 501.

The third adjusting signal herein may be considered as including the first adjusting signal output to the first adjustable resistor R2 and the second adjusting signal output to the second adjustable resistor R3 discussed above.

Then, the method may return to step 1402, and repeat steps 1403 to 1405 until the testing device 1201 determines that the frequency of the clock signal Tclk is equal to the target clock frequency, when the method may proceed to step 1406.

At step 1406, the testing device 1201 determines whether the first voltage VDD_dly is greater than or equal to a voltage safety threshold. The method proceeds to step 1407 when the testing device 1201 determines the first voltage VDD_dly is greater than or equal to the voltage safety threshold; otherwise, the method ends.

When the processor 1302 is configured to determine that the frequency of the clock signal Tclk is equal to the target clock frequency, the first voltage output from the first voltage output terminal "P" is detected, via the third terminal "O" of the interface circuit 1301, as to whether it is greater than or equal to the voltage safety threshold.

In an implementation, the voltage safety threshold value may be considered as a presented safety voltage range when the memory 110 operates normally.

At step 1407, the testing device 1201 outputs a fourth adjusting signal to the voltage adjusting circuit in the memory 110, the fourth adjusting signal being used to decrease the first voltage VDD_dly output by the first voltage output terminal "P".

When the processor 1302 determines that the first voltage VDD_dly output by the first voltage output terminal "P" is greater than or equal to the voltage safety threshold, the fourth adjusting signal may be output to the first terminal "N" of the voltage adjusting circuit 501 via the second terminal "M" of the interface circuit 1301.

Similar to the third adjusting signal, the fourth adjusting signal herein may be considered as including the first adjusting signal output to the first adjustable resistor R2 and the second adjusting signal output to the second adjustable resistor R3 discussed above.

The method may return to step 1402, and repeat steps 1403 to 1405 until the testing device 1201 determines that the frequency of clock signal Tclk output by oscillation circuit 502 reaches the target clock frequency and steps 1406 and 1407 until the first voltage VDD_dly is less than the voltage safety threshold. Then the method ends, and the testing device 1201 stops outputting the adjusting signal to the memory 110. The first voltage VDD_dly obtained by the last adjustment may be the voltage signal that is finally determined to be used to supply power to the delay chain circuit 503.

In an implementation, the target clock frequency may be considered as a frequency range and/or the voltage safety threshold may be considered as a voltage range. In such a scenario, the method can adjust, it is only required that the frequency of the clock signal Tclk be adjusted to be within the frequency range and the value of the first voltage VDD_dly be adjusted to be within the voltage range.

The testing method of the disclosure, when applied to th above testing device 1201, may achieve beneficial effects similar to those of the testing device 1201, which will not be repeated here.

In an implementation, the testing device 1201 may be considered as an off-chip testing device for the memory 110. That is, the memory 110 is tested by the off-chip testing device 1201.

Figure 15:
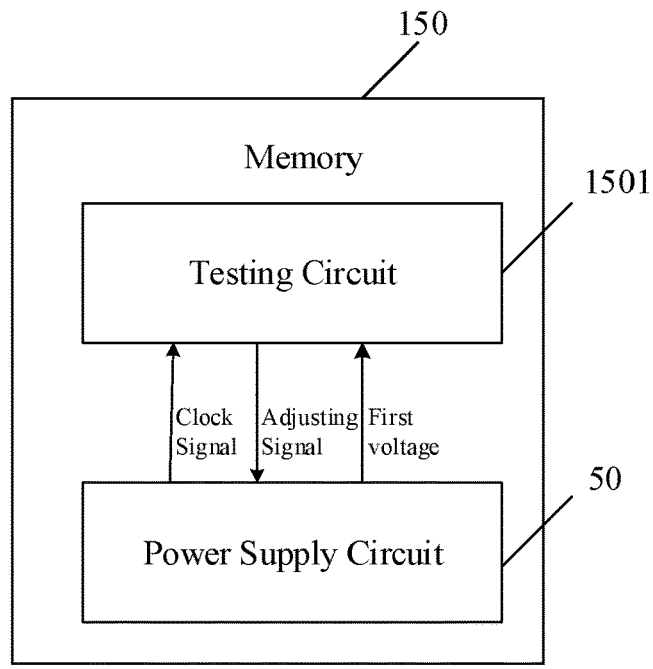
FIG. 15 is a functional block diagram of a memory according to an implementation of the disclosure.

FIG. 15 shows a functional block diagram of a memory 150 according to some implementations. The memory 150 includes a power supply circuit, e.g., a power supply circuit 50, and a testing circuit 1501. The testing circuit 1501 is coupled with the power supply circuit 50. The testing circuit 1501 is configured to input an adjusting signal to the power supply circuit 50 based on a frequency of a clock signal that is output by the power supply circuit 50 and corresponds to a first voltage.

In an implementation, the testing circuit 1501 may be considered as a part of peripheral circuits of the memory array 1101, which is equivalent to the chip testing by the on-chip testing circuit 1501 of the memory 150.

Figure 16:
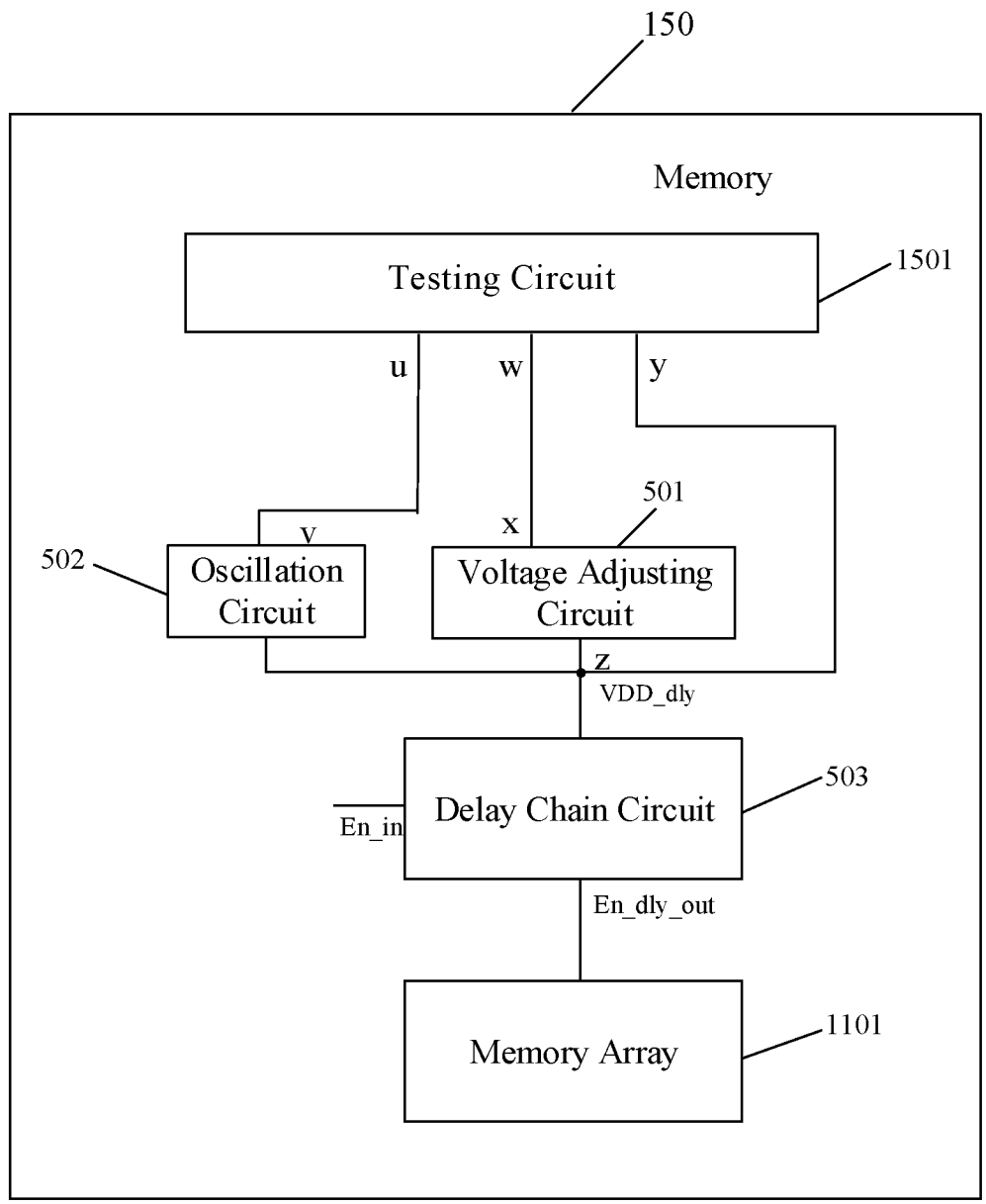
FIG. 16 is a functional block diagram of a memory according to an implementation of the disclosure.

FIG. 16 shows a functional block diagram of a memory 150 in some implementations. A first terminal "u" of a testing circuit 1501 is coupled with a clock output terminal "v" of an oscillation circuit 502, a second terminal "w" of the testing circuit 1501 is coupled with a first terminal "x" of a voltage adjusting circuit 501, and a third terminal "y" of the testing circuit 1501 is coupled with a first voltage output terminal "z" of the voltage adjusting circuit 501.

The testing circuit 1501 is configured to receive, via the first terminal "u" of the testing circuit 1501, a clock signal output from the clock output terminal "v" of the oscillation circuit 502.

When a frequency of the clock signal is determined to be less than a target clock frequency, a third adjusting signal is output to the first terminal "x" of the voltage adjusting circuit 501 via the second terminal "w" of the testing circuit 1501. The third adjusting signal is used to increase a first voltage VDD_dly output by the first voltage output terminal "z".

The testing circuit 1501 is further configured to detect, via the third terminal "y" of the testing circuit 1501, whether the first voltage output by the first voltage output terminal "z" is greater than or equal to a voltage safety threshold when the frequency of the clock signal is determined to be equal to the target clock frequency.

When the first voltage output from the first voltage output terminal is determined to be greater than or equal to the voltage safety threshold, a fourth adjusting signal is output to the first terminal "x" of the voltage adjusting circuit 501 via the second terminal "w" of the testing circuit 1501. The fourth adjusting signal is used to decrease the first voltage output from the first voltage output terminal "z".

It may be understood that the testing method used by the testing circuit 1501 to test the memory 150 is similar to that for the above testing device 1201, and description thereof will not be repeated here.

Figure 17:
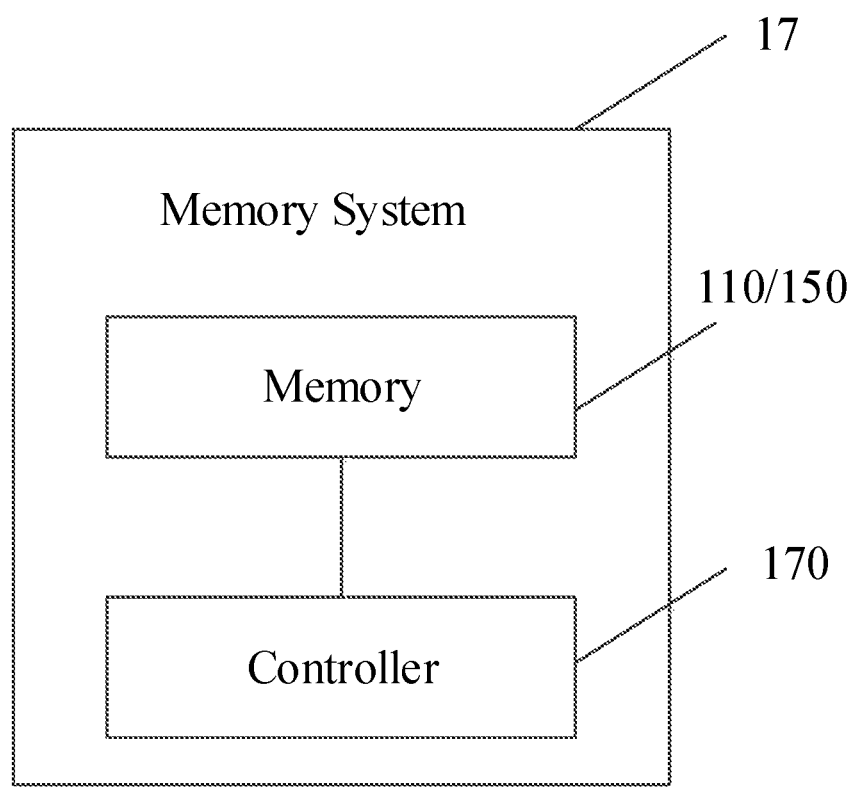
FIG. 17 is a functional block diagram of a memory system according to an implementation of the disclosure.
Figure 18:
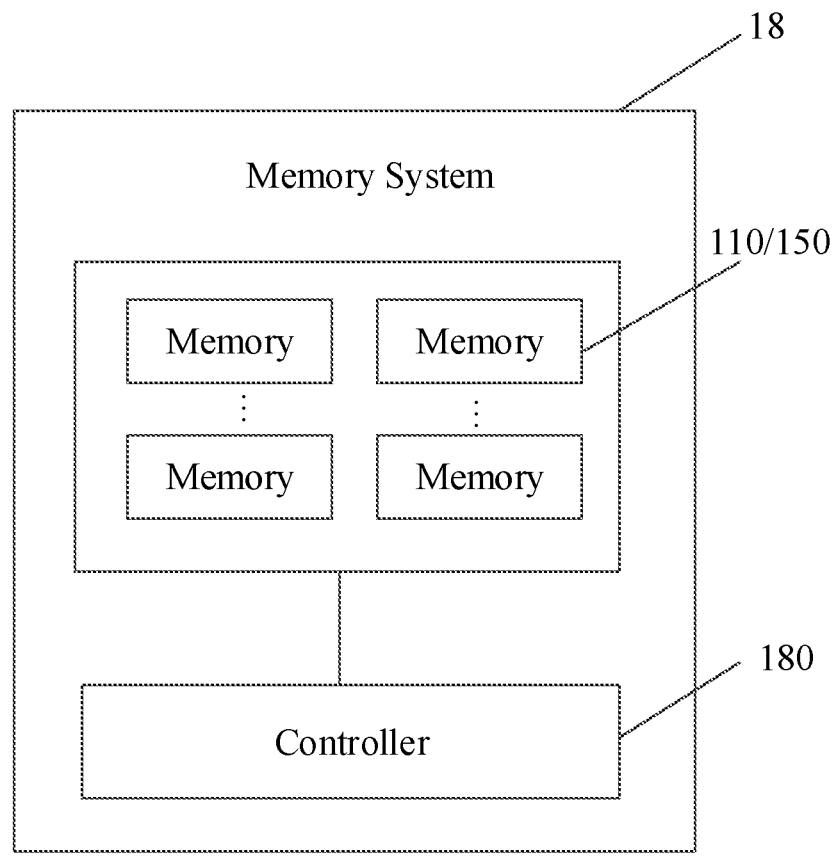
FIG. 18 is a functional block diagram of a memory system according to an implementation of the disclosure.

FIG. 17 is a functional block diagram of a memory system 17 according to some implementations. FIG. 18 is a functional block diagram of a memory system 18 according to some other implementations.

Referring to FIG. 17, some implementations of the disclosure provide a memory system 17. The memory system 17 includes a controller 170, and the memory 110/150 discussed in some implementations above. The controller 170 is coupled to the memory 110/150 to control the memory 110/150 to store data.

In some implementations, the memory system 17 may be integrated into various types of memory devices, for example, in the same package (e.g., Universal Flash Storage (UFS) package or Embedded Multi Media Card (eMMC) package). In some implementations, the memory system 15 may be applied to and packaged into different types of electronic products, such as mobile phones (e.g., cellular phones), desktop computers, tablets, laptop computers, servers, on-vehicle devices, game consoles, printers, positioning devices, wearable devices, smart sensors, mobile power sources, Virtual Reality (VR) devices, Augmented Reality (AR) devices or any other suitable electronic devices equipped with a memory.

Referring to FIG. 17, in some implementations, the memory system 17 includes a controller 170 and a memory 110/150, and the memory system 17 may be integrated into a memory card.

In some implementations, the memory card may include any of PC cards (PCMCIA, Personal Computer Memory Card International Association), Compact Flash (CF) cards, Smart Media (SM) cards, memory sticks, Multimedia Cards (MMCs), Secure Digital Memory Card (SD) cards and UFSs.

Referring to FIG. 18, in some other implementations, the memory system 18 may include a controller 180 and a plurality of memorys 110/150. The memory system 18 may be integrated into a solid state drive (SSD).

In the memory system 18 according to some implementations, the controller 180 may be configured to operate in a low duty cycle scheme, such as SD cards, CF cards, Universal Serial Bus (USB) flash drives, or any other media used in electronic devices such as personal computers, digital cameras, mobile phones, etc.

In some other implementations, the controller 180 may be configured to operate in a high duty cycle scheme, such as SSDs or eMMCs, used as data storage for mobile devices (such as smartphones, tablets, laptop computers, etc.) and enterprise storage arrays.

In some implementations, the controller 180 may be configured to manage data stored in the memory 110/150 and communicate with external devices (e.g., a host). In some implementations, the controller 180 may also be configured to control operations of the memory 110/150, such as reading, erasing, and programming. In some implementations, the controller 180 may also be configured to manage various functions with respect to data stored in or to be stored in the memory 110/150, including at least one of bad-block management, garbage collection, logical-to-physical address conversion, wear leveling, etc. In some implementations, the controller 180 is also configured to process error correction codes with respect to the data read from or written to the memory 110/150.

In some implementations, the controller 180 may also perform any other suitable function, such as formatting the memory 110/150. For example, the controller 180 may communicate with an external device (e.g., a host) according to at least one of various interface protocols.

It should be noted that the interface protocols may include at least one of USB protocol, MMC protocol, Peripheral Component Interconnection (PCI) protocol, PCI-Express (PCI-E) protocol, Advanced Technology Attachment (ATA) protocol, Serial ATA protocol, Parallel ATA protocol, Small Computer System Interface (SCSI) protocol, Enhanced Small Disk Interface (ESDI) protocol, Integrated Driver Electronics (IDE) protocol, Firewire protocol.

Some implementations of the disclosure also provide an electronic device. The electronic device may be any of mobile phones, desktop computers, tablets, laptop computers, servers, on-vehicle devices, wearable devices (such as smart watches, smart bracelets, smart glasses, etc.), mobile power sources, game consoles, digital multimedia players, etc.

Figure 19:
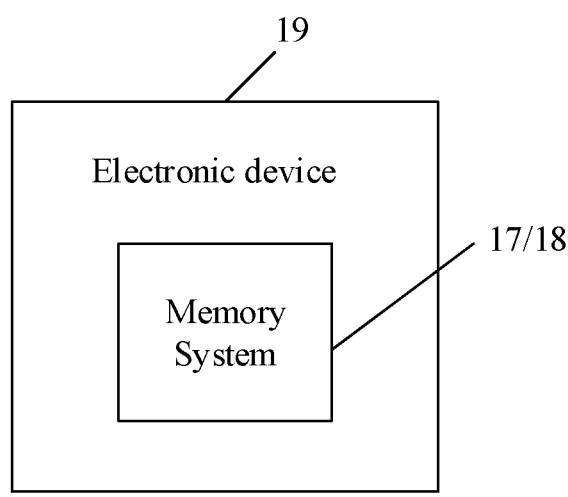
FIG. 19 is a functional block diagram of an electronic device according to an implementation of the disclosure.

FIG. 19 shows a functional block diagram of an electronic device 19. The electronic device 19 may include the memory system 17 or memory system 18 discussed above, and may also include at least one of a central processing unit (CPU), caches, and the like.

The foregoing disclosure provides specific implementations of the disclosure, which, however, does not limit the protection scope of the disclosure. Modifications and replacements that may be made by any skilled person in the art in light of the above disclosure will fall into the protection scope of the disclosure. Therefore, the protection scope of the disclosure shall be consistent with the protection scope defined the claims.

What is claimed is:

1. A power supply circuit, comprising a voltage adjusting circuit and an oscillation circuit, wherein a first voltage output terminal of the voltage adjusting circuit is coupled with a power supply input terminal of a delay chain circuit in a memory, and the first voltage output terminal of the voltage adjusting circuit is coupled with a power supply input terminal of the oscillation circuit, wherein
   the voltage adjusting circuit is configured to output a first voltage to the delay chain circuit and the oscillation circuit via the first voltage output terminal,
   the oscillation circuit is configured to generate a clock signal corresponding to the first voltage,
   the voltage adjusting circuit is further configured to receive an adjusting signal for adjusting the first voltage, and
   the adjusting signal is determined based on a frequency of the clock signal.

2. The power supply circuit of claim 1, wherein
   the voltage adjusting circuit includes a first adjustable circuit and a second adjustable circuit,
   the first adjustable circuit includes a first voltage input terminal and a second voltage output terminal,
   the second adjustable circuit includes a second voltage input terminal, a third voltage input terminal and the first voltage output terminal,
   the second voltage output terminal is coupled with the third voltage input terminal,
   the first voltage input terminal and the second voltage input terminal are configured to receive a power supply voltage signal of the memory,
   the adjusting signal includes a first adjusting signal and a second adjusting signal,
   the first adjustable circuit is configured to output, based on the first adjusting signal, a reference voltage signal to the third voltage input terminal of the second adjustable circuit via the second voltage output terminal, and the second adjustable circuit is configured to output the first voltage based on the reference voltage signal and the second adjusting signal.

3. The power supply circuit of claim 2, wherein the first adjustable circuit includes a first adjustable resistor configured to adjust the reference voltage signal, and
the second adjustable circuit includes a second adjustable resistor configured to adjust the first voltage.

4. The power supply circuit of claim 3, wherein the first adjustable resistor includes a plurality of resistors connected in series and a plurality of switches each connected in parallel with a corresponding one of the plurality of resistors, and
the first adjustable circuit is configured to receive the first adjusting signal, the first adjusting signal being used to control to close or open the switches corresponding to some of the plurality of resistors connected in series in the first adjustable resistor.

5. The power supply circuit of claim 3, wherein the second adjustable resistor includes a plurality of resistors connected in series and a plurality of switches each connected in parallel with a corresponding one of the plurality of resistors, and
the second adjustable circuit is configured to receive the second adjusting signal, the second adjusting signal being used to control to close or open the switches corresponding to some of the plurality of resistors connected in series in the second adjustable resistor.

6. A power supply method, the power supply method being applied to a power supply circuit, the power supply circuit being configured to supply power to a delay chain circuit in a memory, the power supply circuit including a voltage adjusting circuit and an oscillation circuit, wherein a first voltage output terminal of the voltage adjusting circuit is coupled with a power supply input terminal of a delay chain circuit in a memory, the first voltage output terminal of the voltage adjusting circuit is coupled with a power supply input terminal of the oscillation circuit, the voltage adjusting circuit is configured to output a first voltage to the delay chain circuit and the oscillation circuit via the first voltage output terminal, the oscillation circuit is configured to generate a clock signal corresponding to the first voltage, and the voltage adjusting circuit is further configured to receive an adjusting signal for adjusting the first voltage,
the power supply method comprising:
generating the clock signal corresponding to the first voltage, wherein the first voltage is used to be output to the delay chain circuit;
receiving the adjusting signal, the adjusting signal being determined based on a frequency of the clock signal; and
adjusting the first voltage based on the adjusting signal.

7. The power supply method of claim 6, wherein the adjusting signal includes a first adjusting signal and a second adjusting signal, and adjusting the first voltage based on the adjusting signal includes:
outputting a reference voltage based on the first adjusting signal; and
outputting the first voltage based on the reference voltage and the second adjusting signal.

8. The power supply method of claim 6, wherein the voltage adjusting circuit includes a first adjustable circuit and a second adjustable circuit,
the first adjustable circuit includes a first voltage input terminal and a second voltage output terminal,
the second adjustable circuit includes a second voltage input terminal, a third voltage input terminal and the first voltage output terminal,
the second voltage output terminal is coupled with the third voltage input terminal,
the first voltage input terminal and the second voltage input terminal are configured to receive a power supply voltage signal of the memory,
the adjusting signal includes a first adjusting signal and a second adjusting signal,
the first adjustable circuit is configured to output, based on the first adjusting signal, a reference voltage signal to the third voltage input terminal of the second adjustable circuit via the second voltage output terminal, and
the second adjustable circuit is configured to output the first voltage based on the reference voltage signal and the second adjusting signal.

9. The power supply method of claim 8, wherein the first adjustable circuit includes a first adjustable resistor configured to adjust the reference voltage signal, and
the second adjustable circuit includes a second adjustable resistor configured to adjust the first voltage.

10. The power supply method of claim 9, wherein the first adjustable resistor includes a plurality of resistors connected in series and a plurality of switches each connected in parallel with a corresponding one of the plurality of resistors, and
the first adjustable circuit is configured to receive the first adjusting signal, the first adjusting signal being used to control to close or open the switches corresponding to some of the plurality of resistors connected in series in the first adjustable resistor.

11. A memory, comprising:
a power supply circuit including a voltage adjusting circuit and an oscillation circuit, wherein a first voltage output terminal of the voltage adjusting circuit is coupled with a power supply input terminal of a delay chain circuit in a memory, the first voltage output terminal of the voltage adjusting circuit is coupled with a power supply input terminal of the oscillation circuit, the voltage adjusting circuit is configured to output a first voltage to the delay chain circuit and the oscillation circuit via the first voltage output terminal, the oscillation circuit is configured to generate a clock signal corresponding to the first voltage, and the voltage adjusting circuit is further configured to receive an adjusting signal for adjusting the first voltage;
a delay chain circuit having a power supply input terminal, the power supply input terminal coupled with the first voltage output terminal of the power supply circuit and configured to receive a first voltage output from the first voltage output terminal of the power supply circuit; and
a memory array having an input terminal, the input terminal coupled with an output terminal of the delay chain circuit and configured to receive a control signal output from the output terminal of the delay chain circuit,
wherein the adjusting signal is determined based on a frequency of the clock signal.

12. The memory of claim 11, wherein the delay chain circuit includes at least one set of delay units and a bypass circuit coupled with the at least one set of delay units.

13. The memory of claim 11, wherein the delay chain circuit includes a plurality of delay units.

14. The memory of claim 11, further comprising:
a testing circuit coupled with the power supply circuit, the testing circuit configured to input an adjusting signal to the power supply circuit based on a frequency of a clock signal output by the power supply circuit, the clock signal corresponding to the first voltage.

15. The memory of claim 14, wherein
a first terminal of the testing circuit is coupled with a clock output terminal of the oscillation circuit of the power supply circuit,
a second terminal of the testing circuit is coupled with a first terminal of the voltage adjusting circuit of the power supply circuit,
a third terminal of the testing circuit is coupled with the first voltage output terminal of the voltage adjusting circuit,
the testing circuit is configured to receive, via the first terminal of the testing circuit, the clock signal output from the clock output terminal of the oscillation circuit,
a third adjusting signal is output, via the second terminal of the testing circuit, to the first terminal of the voltage adjusting circuit when the frequency of the clock signal is determined to be less than a target clock frequency, and
the third adjusting signal is used to increase the first voltage output from the first voltage output terminal.

16. The memory of claim 15, wherein
the testing circuit is further configured to detect, via the third terminal of the testing circuit, whether the first voltage output from the first voltage output terminal is greater than or equal to a voltage safety threshold when the frequency of the clock signal is determined to be equal to the target clock frequency,
a fourth adjusting signal is output, via the second terminal of the testing circuit, to the first terminal of the voltage adjusting circuit when the first voltage output from the first voltage output terminal is determined to be greater than or equal to the voltage safety threshold, and
the fourth adjusting signal is used to decrease the first voltage output from the first voltage output terminal.

17. The memory of claim 11, wherein
the voltage adjusting circuit includes a first adjustable circuit and a second adjustable circuit,
the first adjustable circuit includes a first voltage input terminal and a second voltage output terminal,
the second adjustable circuit includes a second voltage input terminal, a third voltage input terminal and the first voltage output terminal,
the second voltage output terminal is coupled with the third voltage input terminal,
the first voltage input terminal and the second voltage input terminal are configured to receive a power supply voltage signal of the memory,
the adjusting signal includes a first adjusting signal and a second adjusting signal,
the first adjustable circuit is configured to output, based on the first adjusting signal, a reference voltage signal to the third voltage input terminal of the second adjustable circuit via the second voltage output terminal, and
the second adjustable circuit is configured to output the first voltage based on the reference voltage signal and the second adjusting signal.

18. The memory of claim 17, wherein
the first adjustable circuit includes a first adjustable resistor configured to adjust the reference voltage signal, and
the second adjustable circuit includes a second adjustable resistor configured to adjust the first voltage.

19. The memory of claim 18, wherein
the first adjustable resistor includes a plurality of resistors connected in series and a plurality of switches each connected in parallel with a corresponding one of the plurality of resistors, and
the first adjustable circuit is configured to receive the first adjusting signal, the first adjusting signal being used to control to close or open the switches corresponding to some of the plurality of resistors connected in series in the first adjustable resistor.

20. The memory of claim 18, wherein
the second adjustable resistor includes a plurality of resistors connected in series and a plurality of switches each connected in parallel with a corresponding one of the plurality of resistors, and
the second adjustable circuit is configured to receive the second adjusting signal, the second adjusting signal being used to control to close or open the switches corresponding to some of the plurality of resistors connected in series in the second adjustable resistor.

\* \* \* \* \*